United States Patent
Kouvetakis et al.

(10) Patent No.: US 8,029,905 B2
(45) Date of Patent: Oct. 4, 2011

(54) GESISN-BASED COMPOUNDS, TEMPLATES, AND SEMICONDUCTOR STRUCTURES

(75) Inventors: John Kouvetakis, Mesa, AZ (US); Radek Roucka, Tempe, AZ (US)

(73) Assignee: Arizona Board of Regents, a Body Corporate of the State of Arizona acting for and on behalf of Arizona State University, Scottsdale, AZ (US)

( * ) Notice: Subject to any disclaimer, the term of this patent is extended or adjusted under 35 U.S.C. 154(b) by 131 days.

(21) Appl. No.: 11/908,143

(22) PCT Filed: Mar. 10, 2006

(86) PCT No.: PCT/US2006/008654
§ 371 (c)(1),
(2), (4) Date: Sep. 10, 2007

(87) PCT Pub. No.: WO2006/099171
PCT Pub. Date: Sep. 21, 2006

(65) Prior Publication Data
US 2008/0187768 A1 Aug. 7, 2008

Related U.S. Application Data

(60) Provisional application No. 60/660,779, filed on Mar. 11, 2005.

(51) Int. Cl.
*B32B 15/04* (2006.01)
*C01B 33/00* (2006.01)
(52) U.S. Cl. .................................... 428/450; 423/324
(58) Field of Classification Search .................. 428/450; 423/324; 257/183
See application file for complete search history.

(56) References Cited

U.S. PATENT DOCUMENTS

| | | | | |
|---|---|---|---|---|
| 5,187,715 A | * | 2/1993 | Weisbuch et al. | 257/21 |
| 5,300,794 A | * | 4/1994 | Melman et al. | 257/190 |
| 5,548,128 A | | 8/1996 | Soref et al. | |
| 6,136,672 A | * | 10/2000 | Bourdelle et al. | 438/530 |
| 6,897,471 B1 | * | 5/2005 | Soref et al. | 257/22 |
| 6,911,084 B2 | | 6/2005 | Kouvetakis et al. | |

(Continued)

FOREIGN PATENT DOCUMENTS
EP 0279989 A2 8/1988
(Continued)

OTHER PUBLICATIONS

Bauer, M., et al., "Synthesis of ternary SiGeSn semiconductors on Si(100) via SnxGe1-x buffer layers," Applied Physics Letters, Sep. 15, 2003, 83(11):2163-2165.

(Continued)

*Primary Examiner* — Leonardo Andujar
*Assistant Examiner* — Jordan Klein
(74) *Attorney, Agent, or Firm* — McDonnell Boehnen Hulbert & Berghoff LLP

(57) ABSTRACT

The present invention provides novel compounds of the formula $Ge_{1-x-y}Si_xSn_y$, wherein $0.01 < y < 0.11$, and $0.26 < x < 0.35$, and semiconductor structures comprising such compounds. The present invention also provides novel semiconductor structures comprising silicon substrates, an SiGe buffer layer, and a Group III-V or II-VI active layer. The present invention also provides novel semiconductor structures comprising silicon substrates, an SiGe buffer layer, an SiGeSn template layer, and an SiGe, Ge, Group III-V, or Group II-VI active layer.

19 Claims, 15 Drawing Sheets

U.S. PATENT DOCUMENTS

| | | | |
|---|---|---|---|
| 7,238,596 | B2 | 7/2007 | Kouvetakis et al. |
| 7,374,738 | B2 | 5/2008 | Kouvetakis et al. |
| 7,582,891 | B2 * | 9/2009 | Kouvetakis et al. ............ 257/14 |
| 7,589,003 | B2 | 9/2009 | Kouvetakis et al. |
| 7,598,513 | B2 | 10/2009 | Kouvetakis et al. |
| 2002/0030194 | A1 * | 3/2002 | Camras et al. .................. 257/98 |
| 2002/0101895 | A1 * | 8/2002 | Augusto ....................... 257/184 |
| 2002/0140012 | A1 * | 10/2002 | Droopad ....................... 257/295 |
| 2002/0154675 | A1 * | 10/2002 | Deng et al. ...................... 372/96 |
| 2004/0011280 | A1 | 1/2004 | Higuchi et al. |
| 2004/0261689 | A1 | 12/2004 | Kouvetakis et al. |
| 2005/0056210 | A1 * | 3/2005 | El-Zein et al. .................. 117/89 |
| 2006/0163612 | A1 * | 7/2006 | Kouvetakis et al. .......... 257/201 |
| 2006/0236923 | A1 | 10/2006 | Kouvetakis et al. |
| 2007/0297967 | A1 | 12/2007 | Kouvetakis et al. |
| 2008/0113186 | A1 | 5/2008 | Kouvetakis et al. |
| 2008/0164570 | A1 | 7/2008 | Kouvetakis et al. |
| 2009/0050935 | A1 | 2/2009 | Kouvetakis et al. |

FOREIGN PATENT DOCUMENTS

| | | |
|---|---|---|
| JP | 63108782 | 5/1988 |
| WO | 02/09187 A2 | 1/2002 |
| WO | 03/033781 | 4/2003 |
| WO | 2003/058644 | 7/2003 |
| WO | 2004/073045 | 8/2004 |
| WO | 2004/114368 | 12/2004 |
| WO | 2005/001902 | 1/2005 |
| WO | 2005/015609 | 2/2005 |
| WO | 2006/031240 | 3/2006 |
| WO | 2006/031257 | 3/2006 |
| WO | 2006/034025 | 3/2006 |
| WO | 2007/062056 | 5/2007 |
| WO | 2007/062096 | 5/2007 |

OTHER PUBLICATIONS

Kouvetakis, J., et al., "New IR Semiconductors in the Si-Ge-Sn System," 2004 1st IEEE International Conference on Group IV Photonics, Sep. 29, 2004, pp. 55-57.

Menendez et al., "Type-1 $Ge/Ge_{1-x-y}Si_xSn_y$ strained-layer heterostructures with a direct Ge Bandgap" Applied Physics Letters, Aug. 16, 2004, vol. 85, No. 7, pp. 1175-1177.

M. Bauer, et al., Appl. Phys. Lett., 81, 2992-2994 (2002).
A.V.G Chizmeshya, et al. Chem. of Matls., 15, 2511-2519 (2003).
M. Bauer, et al., Appl. Phys. Lett., 83(11), 2163-2165 (2003).
M. Bauer, et al. Appl. Phys. Lett., 83, 3489-3491 (2003).
P. Aella, et al., Appl. Phys. Lett. 84, 888-890 (2004).
R. Roucka, et al., Appl. Phys. Lett. 86(19), 191912-191914 (2005).
G. He and H. Atwater, Appl. Phys. Lett. 68(5), 664-666 (1996).
Pristovsek M., et al., Journal of Crystal Growth 276(3-4), 347-353 (2005).
Wosinski A., et al., Appl. Phys. Lett. 67(8), 1131-1133 (1995).
Dvorak M. W., et al., IEEE Electron Device Letters 22(8), 361-363 (2001).
Ryu, Sang-Wan, et al., Semiconductor Science and Technology 19(12), 1369-1372 (2004).
Dowd P., et al., Electronics Letters 39(13), 987-988 (2003).
Liguang Zheng, et al., IEEE Photonics Technology Letters, 17(3), 651 (2005).
Xiaoguang Sun, et al., IEEE Journal of Selected Topics in Quantum Electronics, vol. 8, Issue 4, 817-822 (2002).
Kaniewski J., et al., Proceedings of SPIE-The International Society for Optical Engineering (2005), 5783 (Pt. 1, Infrared Technology and Applications XXXI), 47-56.
Kang Y., et al., Applied Physics Letters (2004), 85(10), 1668-1670.
Kim S., et al., Jpn. J. App. Phys. 44, 2472-2475 (2005).
Cristea P., et al., J. Cryst. Growth 278(1-4), 544-547 (2005).
Li Y.J., et al., J. of Vac. Sci. Tech. B 22(5), 2429-2433 (2004).
Mao R. W., et al., IEEE Photonics Technology Letters 16(8), (2004).
Pauchard A., et al, Proceedings of SPIE—The International Society for Optical Engineering, 4650 (Photodetector Materials and Devices VII), 37-43 (2002).
Takano Y., et al., Appl. Phys. Lett. 78(1), 93-95 (2001).
Chriqui Y., et al., Optical Materials 27, 846-850 (2005).
V. K. Yang, et al., J. Appl. Phys. 93(9), 5095-5102 (2003).
Kouvetakis et al., Annu. Chem. Mater. Rev. 2006, 36, 497-554.
Tolle et al., Mater. Res. Soc. Symp. Proc. 2006, 891, 0897-EE12-08.1.

* cited by examiner

GESISN-BASED COMPOUNDS, TEMPLATES, AND SEMICONDUCTOR STRUCTURES

CROSS REFERENCE

This application claims priority to U.S. Provisional Patent Application Ser. No. 60/660,779, filed Mar. 11, 2005, which is incorporated by reference herein in its entirety.

STATEMENT OF GOVERNMENT FUNDING

Financial assistance for this invention was provided by the United States Government, National Science Foundation Grant Number DMR 0221993 and Air Force Office for Scientific Research under Contract AFRL/SNHC (F19628-03-C-0056). Therefore, the United States Government may own certain rights to this invention.

FIELD OF THE INVENTION

This invention relates generally to GeSiSn-based compounds, templates, and semiconductor structures derived therefrom.

BACKGROUND OF THE INVENTION

The concept of buffer layers is well-known and widely used in heteroepitaxy of semiconductors. They are designed to alleviate interfacial stress and defect formation or to promote growth of certain phases or 2D morphology. For highly mismatched systems, the concept of graded buffer layers was first proposed at RCA in 1966, and most efforts to date have been designed to find solutions to specific problems rather than a global pathway to semiconductor integration. From all integration schemes, the integration of III-V and II-VI semiconductors with silicon would have the most favorable impact on functionality, miniaturization and production cost.

Low Al content AlGaAs compounds possess lattice constants close to that of Ge. As such, Ge seems to be a reasonable pathway to monolithic integration of some arsenide-based devices with Si. Although Si and Ge are closely related, direct epitaxy of Ge on Si produces copious defects in the Ge layer due to a significant lattice and thermal mismatch. To alleviate this problem, research in recent years has focused on graded $Si_{1-x}Ge_x$ buffer layers grown on Si(100). In this case, a thick $Si_{1-x}Ge_x$ interlayer is graded compositionally up to 100% Ge to create a virtual substrate that is nearly lattice matched to GaAs. A graded layer thickness in excess of 10 µm is required to achieve threading dislocation densities in the $10^6$ per $cm^2$ range, and a post growth chemical mechanical polishing (CMP) step is necessary to produce a smooth surface prior to subsequent growth.

While the above approach is relatively straightforward it poses several limitations: (1) the addressable lattice parameter space is limited to a narrow range between Si and Ge, thus allowing lattice matching of only three compounds (GaAs, GaP, and AlP); (2) the process requires thick buffer layers grown at a relatively high temperature, which causes additional defect formation due to thermal mismatch; (3) a post-growth, CMP planarization step is mandatory; and (4) threading defect densities are in the $10^6$ per $cm^2$ range, which is detrimental to most advanced compound devices; a reduction in defect density of two to three orders of magnitude is needed.

Thus, improved materials and methods for integration of III-V and II-VI semiconductors with silicon are needed in the art.

SUMMARY OF THE INVENTION

In a first aspect, the present invention provides novel compounds of the formula $Ge_{1-x-y}Si_xSn_y$, wherein $0.01 < y \leqq 0.11$, and $0.26 \leqq x \leqq 0.35$. In one embodiment, the present invention provides semiconductor structures, comprising an Si substrate, a GeSn buffer layer formed over the Si substrate; and a template layer comprising the $Ge_{1-x-y}Si_xSn_y$ compounds of this first aspect of the invention. In a further embodiment, the semiconductor substrates further comprise an active layer formed over the template layer, wherein the active layer is selected from the group consisting of
 (i) a Group III-V layer;
 (ii) a Group II-VI layer;
 (iii) an SiGe layer; and
 (iv) a Ge layer.

In a second aspect, the present invention provides semiconductor structures, comprising:
 (a) an Si substrate;
 (b) a GeSn buffer layer formed over the substrate; and
 (c) an active layer formed over the buffer layer, wherein the active layer is selected from the group consisting of
 (i) a Group III-V layer; and
 (ii) a Group II-VI layer.

In a third aspect, the present invention provides semiconductor structures comprising:
 (a) an Si substrate;
 (b) a GeSn buffer layer formed over the substrate;
 (c) an SiGeSn template layer formed over the buffer layer; and
 (d) an active layer formed over the buffer layer, wherein the active layer is selected from the group consisting of
 (i) a Group III-V layer;
 (ii) a Group II-VI layer;
 (iii) an SiGe layer; and
 (iv) a Ge layer.

In one preferred embodiment of each of the first, second, and third aspects of the invention, the active layer is a Group III-V layer, and the Group III-V layer comprises an alloy selected from the group consisting of InAs, GaAs, InGaAs, AlAs, InP, GaSb, InSb, GaSbAs, and AlGaAs. In a further preferred embodiment of each of the first, second, and third aspects of the invention, the active layer is a Group II-VI layer, and wherein the Group II-VI layer comprises an alloy selected from the group consisting of ZnSe, ZnS, ZnTe, CdS, ZnCdTe, ZnSTe, CdMnTe, CdTe, CdSe, and HgCdTe,

BRIEF DESCRIPTION OF THE FIGURES

The accompanying drawings, which are incorporated in and constitute a part of the specification, illustrate the presently preferred methods and embodiments of the invention and, together with the general description given above and the detailed description of the preferred methods and embodiments given below, serve to explain the principles of the invention.

DETAILED DESCRIPTION OF THE INVENTION

Figure 1:
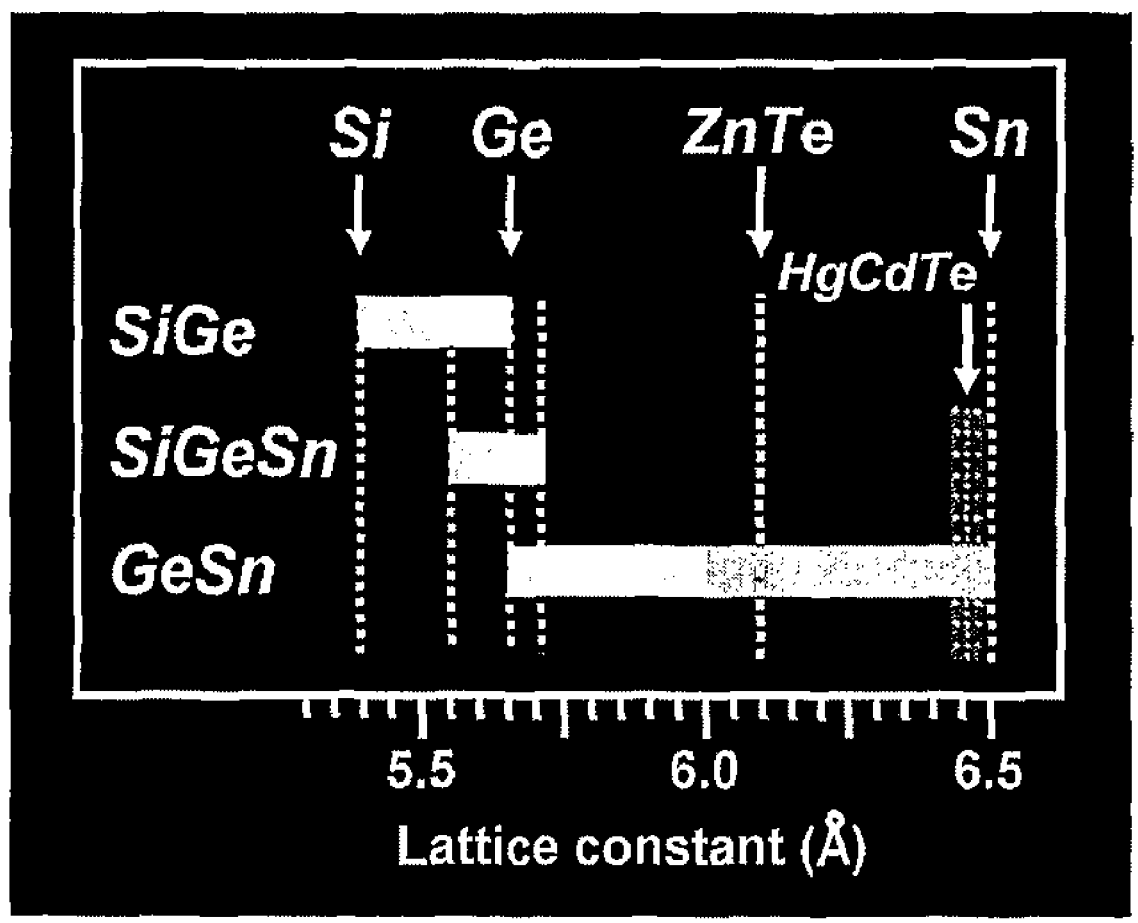
FIG. 1. Range of lattice constants in Si—G—Sn alloys and in II-VI (Zn—Cd—Hg—Te). The accessible values using either binary or ternary alloying are shown. The light bars denote compositions that we have actually grown. Most III-Vs fall within that range.
Figure 2:
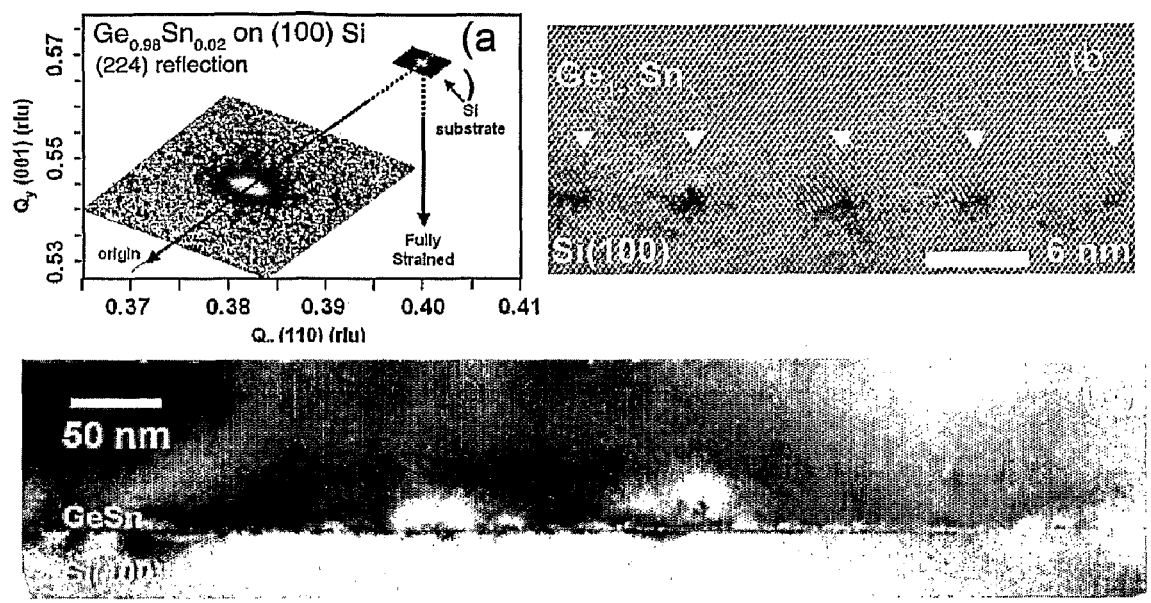
FIG. 2 (a) Reciprocal space maps of the (224) reflections of Si substrate and GeSn layer indicating a strain-free film. Note that the (224) GeSn peak lies on the line connecting the (224) Si peak with the origin consistent with full relaxation. (b) Ge—Sn/Si(100) interface showing the location of Lomer defects (arrows) (c) Bright field XTEM image of a GeSn/Si (100) layers grown at 325° C. showing a smooth surface and no threading defects.

All publications, patents and patent applications cited herein are hereby expressly incorporated by reference for all purposes.

As used herein, the singular forms "a", "an" and "the" include plural referents unless the context clearly dictates otherwise.

In a first aspect, the present invention provides novel compounds of the formula $Ge_{1-x-y}Si_xSn_y$, wherein $0.01<y\leq0.11$, and $0.26\leq x\leq0.35$ and. Previous ternary $Ge_{1-x-y}Si_xSn_y$ complexes have been limited to Si contents of 0.25 or less. The presently recited $Ge_{1-x-y}Si_xSn_y$ compounds with an increased Si content are useful for fabricating novel compound semiconductor devices with tunable band gaps that are suitable for microelectronic devices, optical devices, lasers, and infrared photodetectors. In various preferred embodiments, $y\geq\sim0.02$, 0.03, 0.04, 0.05, 0.06, 0.07, 0.08, 0.09, and 0.10. In various further preferred embodiments, x is $\geq\sim0.27, 0.28, 0.29, 0.30, 0.31, 0.32, 0.33,$ or $0.34$.

These $Ge_{1-x-y}Si_xSn_y$ compounds were made using methods described in WO 05/015609). As disclosed in WO 05/015609, the synthetic scheme for preparing $Ge_{1-x-y}Si_xSn_y$ compounds involves ultra-high vacuum chemical vapor deposition (UHV-CVD) reactions of the gaseous compound $SiH_3GeH_3$ with $SnD_4$. The former is a simple derivative of digermane, $GeH_3GeH_3$, in which one of the $GeH_3$ groups is replaced with $SiH_3$ thus forming a molecular core with direct Si—Ge bonds. $H_3SiGeH_3$ is a stable, gaseous molecule with a boiling point of about 7° C., and it is synthesized via a novel and high yield method outlined below: $CF_3SO_3SiH_3$+ $KGeH_3$, yielding $H_3SiGeH_3$+$KO_3SCF_3$. In addition to the high yield, which makes the $H_3SiGeH_3$ commercially attractive for semiconductor applications, this method also provides the required high quality material suitable for device development and processing. Methods for precursor synthesis, as well as more detailed synthetic protocols, are also disclosed in WO 05/015609.

In further embodiments, any other gaseous SiGe hydride compounds can be used in the synthesis of the $Ge_{1-x-y}Si_xSn_y$ compounds of the present invention. Such other SiGe hydride compounds include, but are not limited to, $(H_3Ge)_xSiH_{4-x}$; compounds according to this formula include $H_2Si(GeH_3)_2$, $H_2Si(GeH_3)_3$, $Si(GeH_3)_4$, and $Si(GeH_3)_4$ Synthesis of these compounds utilizes low temperature reactions of a suitable germyl ligand, such as $KGeH_3$, with triflate- and perfluoroalkylsulfonyloxy-substituted silanes such as $H_xSi(SO_3CF_3)_{4-x}$, and $H_xSi(SO_3C_4F_9)_{4-x}$, (x=1,2, or 3), in suitable solvents. The starting triflate- and perfluoroalkylsulfonyloxy-substituted silanes were prepared via reactions of the corresponding phenylsilanes and the appropriate sulfonic acids (PCT/US04/43854, incorporated by reference herein in its entirety).

In another embodiment, the present invention provides semiconductor structures, comprising an Si substrate, a GeSn buffer layer formed over the Si substrate; and a $Ge_{1-x-y}Si_xSn_y$ template layer formed over the buffer layer, where the $Ge_{1-x-y}Si_xSn_y$ template layer is of formula $Ge_{1-x-y}Si_xSn_y$, wherein $0.01<y\leq0.11$, and $0.26\leq x\leq0.35$. As noted above, the $Ge_{1-x-y}Si_xSn_y$ compositions, and semiconductor structures comprising buffer layers of such compositions, are useful for fabricating novel compound semiconductor devices with tunable band gaps that are suitable for microelectronic devices, optical devices, lasers, and infrared photodetectors.

In this embodiment, the buffer layer is grown directly on a silicon substrate, such as Si (100) or silicon on insulator.

The GeSn buffer layers can be any GeSn layer suitable for use in the semiconductor substrates of any of the aspects of the present invention, but preferably $Ge_{1-x}Sn_x$, wherein x is between ~0.02 and 20, as disclosed in WO 2005/001902. In various preferred embodiments, the Sn content in the GeSn buffer layer can be ~0.02. 0.03. 0.04. 0.05. 0.06, 0.07, 0.08, 0.09, 0.10, 0.11, 0.12, 0.13, 0.14, 0.15, 0.16, 0.17, 0.18, 0.19, or 0.20. The device-quality single-crystal $Ge_{1-x}Sn_x$ alloys are grown directly on Si (100) using a CVD growth technique based on reactions of $SnD_4$ gas as the source of Sn atoms, as disclosed in WO 05/001902.

In a preferred embodiment of the semiconductor structure of the first aspect of the invention, the GeSn buffer layer has a thickness of between ~50 nm and 1 μm, more preferably between ~50 nm and 500 nm. In a further preferred embodiment, the GeSn buffer layer has a density of threading defects of ~$10^5$/cm$^2$ or less prior to deposition of the $Ge_{1-x-y}Si_xSn_y$ layer; however, the GeSn buffer layer often contains significant levels of defects after $Ge_{1-x-y}Si_xSn_y$ layer deposition. While not being bound by any specific mechanism, we believe that the GeSn buffer layer possesses a unique ability to absorb stress from a mismatched overlayer; this property is enhanced as the Sn content of the GeSn buffer layer increases. In a further preferred embodiment, the GeSn buffer layer grows strain-free directly on Si but not on $SiO_2$, and display a substantially atomically planar surface morphology. In a further preferred embodiment, the GeSn buffer layer exhibits a tunable lattice constant between ~5.657 and 6.00 Å. In a further preferred embodiment, only the GeSn buffer layers on Si that display RBS $_{102\ min}$ channeling of ~5-6%, RMS roughness of ~0.5-1 nm and XRD rocking curves with FWHM of less than ~0.2 degrees are utilized for subsequent growth.

In a preferred embodiment, the $Ge_{1-x-y}Si_xSn_y$ layer has a thickness of thickness of between ~10 nm and 1 μm or less, more preferably between ~10 nm and 500 nm. In a further preferred embodiment, the $Ge_{1-x-y}Si_xSn_y$ layer has a density of threading defects of ~$10^5$/cm$^2$ or less. In a further preferred embodiment, the $Ge_{1-x-y}Si_xSn_y$ layer has a substantially atomically planar surface morphology. In a further preferred embodiment, the $Ge_{1-x-y}Si_xSn_y$ layer exhibits a tunable lattice constant between ~5.4 and 6.0 Å.

In a further embodiment, the semiconductor substrates further comprise an active layer formed over the template layer, wherein the active layer comprises or consists of a layer selected from the group consisting of
  (i) a Group III-V layer;
  (ii) a Group II-VI layer;
  (iii) an SiGe layer; and
  (iv) a Ge layer.

More detailed discussion of these active layers is provided below.

In a second aspect, the present invention provides semiconductor structures, comprising:
  (a) an Si substrate;
  (b) a GeSn buffer layer formed over the substrate; and
  (c) an active layer formed over the buffer layer, wherein the active layer comprises a layer selected from the group consisting of
  (i) a Group III-V layer; and
  (ii) a Group II-VI layer.

Si substrates and GeSn buffer layers are described above; Group III-V and Group II-VI active layers are discussed below.

In a third aspect, the present invention provides semiconductor structures comprising:
  (a) an Si substrate;
  (b) a GeSn buffer layer formed over the substrate;
  (c) an SiGeSn template layer formed over the buffer layer; and
  (d) an active layer formed over the buffer layer, wherein the active layer comprises a layer selected from the group consisting of
  (i) a Group III-V layer;
  (ii) a Group II-VI layer;
  (iii) an SiGe layer; and
  (iv) a Ge layer.

The present invention has demonstrated for the first time the production of the recited semiconductor structures of the second and third aspects of the invention, which can be used, for example, for preparing microelectronic devices, optical devices, lasers, and infrared photodetectors.

Si substrates and GeSn buffer layers are described above. The SiGeSn template layer can be any such SiGeSn template layer suitable for use in the semiconductor substrates of the second and third aspects of the invention, but preferably are of the formula $Ge_{1-x-y}Si_xSn_y$, wherein y is ~0.01 to 0.11 and x is between ~0.10 and 0.35. In various embodiments, y is ~0.02. 0.03. 0.04. 0.05. 0.06, 0.07, 0.08, 0.09, 0.10, or 0.11. Similarly, in various embodiments, x is ~0.11, 0.12, 0.13, 0.14, 0.15, 0.16, 0.17, 0.18, 0.19, 0.20, 0.21, 0.22, 0.23, 0.24, 0.25, 0.26, 0.27, 0.28, 0.29, 0.30, 0.31, 0.32, 0.33, or 0.34.

In a preferred embodiment of the semiconductor structure of all of the aspects of the invention, the active layer has a thickness of thickness of between ~10 nm and 1 μm, more preferably between ~50 nm and 500 nm. In a further preferred embodiment, the active layer has a density of threading defects of ~$10^5$/cm$^2$ or less. In a further preferred embodiment, the active layer has a substantially atomically planar surface morphology. In a further preferred embodiment, the active layer exhibits a tunable lattice constant between ~5.4 and 6.0 Å.

In a preferred embodiment of each of the first, second, and third aspects of the invention, the active layer comprises or consists of a Group II-VI layer, which can comprise any II-VI layer, including but not limited to alloys selected from the group consisting of ZnSe, ZnS, ZnTe, CdS, ZnCdTe, ZnSTe, CdTe, CdSe, ZnCdMgSe, ZnMgSSe, and HgCdTe.

In a further preferred embodiment of each of the first, second, and third aspects of the invention, the active layer comprises or consists of a Group III-V layer, which can comprise any combination of the families (In, Ga, Al) and (N, P, As, and Sb). In a preferred embodiment, the III-V layer comprises an alloy selected from the group consisting of InAs, GaAs, InGaAs, AlAs, InP, GaSb, InSb, GaAsSb, AlGaAs, InGaAsSb, and InGaNAsSb.

As will be apparent to those of skill in the art, the active layer can comprise more than one such active layer, for example, a quantum well stack or heterostructure.

In one preferred embodiment, the III-V active layer comprises or consists of InGaAs. It is further preferred that the InGaAs active layer comprises or consists of compounds according to $In_xGa_{1-x}As$, where x is ~0.03 to 0.40. Thus, in various further embodiments, x is ~0.04, 0.05, 0.06, 0.07, 0.08, 0.09, 0.10, 0.11, 0.12, 0.13, 0.14, 0.15, 0.16, 0.17, 01.8, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, or 0.39.

In another preferred embodiment, the III-V active layer comprises or consists of GaAs and/or AlGaAs. In a further preferred embodiment, the GaAs and/or AlGaAs active layer comprises or consists of an AlGaAs/GaAs/AlGaAs quantum well stack.

In a further preferred embodiment, the III-V active layer comprises or consists of GaAsSb. It is further preferred that the GaAsSb active layer comprises a GaAs$_{1-x}$Sb$_x$ alloy system wherein x is between ~0.02 and 0.40. Thus, in various further embodiments, x is ~0.03, 0.04, 0.05, 0.06, 0.07, 0.08, 0.09, 0.10, 0.11, 0.12, 0.13, 0.14, 0.15, 0.16, 0.17, 01.8, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, or 0.39.

Any SiGe layer or active Ge layer suitable for the desired use of the semiconductor structure can be used as the active layer the different aspects of the present invention; such active SiGe and Ge layers are well known to those of skill in the art. Tensile stained Ge on GeSn or SiGeSn can possess a direct band gap and can be used as an emitter or as a detector fully integrated with Si technologies.

In a further embodiment of the first, second, and third embodiments, the semiconductor structure may further comprise other features as desired, including but not limited to the inclusion of dopants, such as boron, phosphorous, arsenic, and antimony (where the active layer is GeSi or Ge). Inclusion of such dopants into the semiconductor active layer can be carried out by standard methods in the art. In a further embodiment, the semiconductor structure may further comprise varying quantities of carbon, as desired for a given application. Inclusion of carbon into the semiconductor substrates can be carried out by standard methods in the art. The carbon can be used to reduce the mobility of the dopants in the structure and more specifically boron.

The semiconductor structures of each of the first, second, and third aspects of the invention utilize a GeSn buffer layer. Device-quality single-crystal Ge$_{1-x}$Sn$_x$ alloys are grown directly on a silicon substrate (as disclosed above), such as Si (100) or silicon on insulator, using a chemical vapor deposition (CVD) growth technique based on reactions of SnD$_4$ gas as the source of Sn atoms, as disclosed in WO 05/001902. This technique yields films of much higher quality than any previously reported MBE materials even when compared to thick films. This work with GeSn buffer layers demonstrates that:

(a) GeSn layers grow strain-free directly on Si with low threading defect densities in the range of ~10$^5$ cm$^{-2}$ even for layers thinner than 1 μm.

(b) The GeSn layers grow in a low temperature range ~250-350° C., compatible with selective growth, and possess the necessary thermal stability for conventional semiconductor processing (up to ~750° C. depending on composition).

(c) GeSn can in principle exhibit random alloy cubic structure and tunable lattice constant between ~5.657 and 6.491 Å, well within the range of Si and II-VIs and III-Vs. GeSn with 20% Sn content have a lattice constant of ~6.0 Å).

(d) The GeSn layers display atomically flat surface morphologies free of threading defects thus providing an ideal platform for subsequent growth of compound semiconductors.

(e) The GeSn films provide a cushioning effect that can absorb defects caused by the differential strain imposed in highly mismatched heteroepitaxy applications.

(f) They grow selectively on Si and not on SiO$_2$.

(g) The film surface can be prepared by simple chemical cleaning methods for subsequent ex-situ epitaxial growth.

In addition to the perfect lattice match, the GeSn buffer layer system offers a unique opportunity also for thermal matching to most compound semiconductors. Si and Ge have significantly different coefficients of thermal expansion, 2.5 and 6.1×10$^{-6}$ K$^{-1}$, respectively. The values for III-V and II-VI compounds fall into this range. Exploration of the GeSn compositional range to develop new ways of integration compound semiconductors with Si through simultaneous lattice and thermal matching is a focus of this invention. Small concentrations of Si may be incorporated into GeSn to obtain SiGeSn ternaries that could provide tunable thermal matching with such compounds. The unique ability of this system to absorb defects provides an avenue for achieving defect densities in the device structures in the 10$^3$ cm$^{-2}$ range. In contrast, SiGe and Ge-based buffer layers are too rigid to provide this kind of defect mitigation.

Our studies indicate that GeSn alloys exhibit high ductility (i.e., they are "softer solids") and thereby serve as "stress relievers" which readily absorb differential stress imposed by stiffer systems. This concept is clearly demonstrated in the example presented in FIG. 3 which shows a bright field TEM micrograph of a highly mismatched newly synthesized SiGeSn/GeSn heterostructure grown on Si(100). The single-phase Si$_x$Sn$_y$Ge$_{1-x-y}$ alloys are routinely grown on GeSn buffer layers via UHV-CVD reactions of the gaseous compound SiH$_3$GeH$_3$ (or GeH$_3$SiH$_2$GeH$_3$) with SnD$_4$ and possess lattice constants below and above that of bulk Ge. The lattice constants for the two layers in FIG. 3 were 5.58 and 5.71 Å, respectively, and the shear modulus of SiGeSn was higher than that of GeSn due to an 18% Si content.

Figure 3:
FIG. 3. TEM image of a highly mismatched GeSiSn/GeSn/Si heterostructure showing that the top layer is defect free and displays a smooth surface. The bulk of the defects are concentrated in the buffer layer. Note that defects originating at the GeSiSn/GeSn interface appear to be absorbed by the "softer" GeSn buffer layer (arrows).

Note that the SiGeSn top layer is virtually defect free while the underlying GeSn buffer layer contains significant levels of defects that propagate throughout the layer. The presence of defects in the GeSn layer is unexpected since the same GeSn material "as grown" on Si is practically free of threading defects, as shown in FIG. 3. The only plausible explanation is that the defects in the SiGeSn/GeSn/Si case are generated by the large differential stress due to the lattice mismatch between the two layers in the heterostructure and the Si substrate. In fact, a number of these defects appear to originate at the SiGeSn/GeSn interface and show a propensity to propagate downward into GeSn buffer layer, as shown by the arrows in FIG. 3. This result suggests that GeSn buffer layer possesses a potentially unique ability to absorb stress from a mismatched overlayer. The Sn content in the above buffer layer was only 0.02. First principle thermoelastic simulations indicate that as the Sn content increases in the buffer layer, the bulk modulus decreases. Accordingly, the ability of the GeSn layer to absorb even higher densities of defects is enhanced. This is particularly important for the high Sn content buffer layers that possess larger lattice parameters and softer cubic lattices and thereby could enable a wide range of mismatched heteroepitaxy systems to be integrated with Si.

A very important feature of the heterostructure shown in FIG. 3 is the high quality in the SiGeSn overlayer. The layer morphology is perfectly planar suggesting that the SiGeSn system can serve as an ideal template for integrated growth on Si, in its own right. These materials form more readily and exhibit greater thermal stability and in most cases superior crystallinity than their Ge$_{1-x}$Sn$_x$ counterparts. Combined with the previous demonstration of Ge$_{1-x}$Sn$_x$ films, the new ternary system provides unprecedented flexibility for lattice and thermal engineering in group-IV alloys. Therefore these materials can act as potentially superior templates for subsequent growth of III-V and II-IV compounds for the following reasons:
1. Incorporation of Si into $Ge_{1-x}Sn_x$ enables better thermal matching of III-V and II-IV systems.
2. Improved crystallinity and lower threading defect densities ($\sim 10^5/cm^2$).
3. Higher thermal stability compared to $Ge_{1-x}Sn_x$.

The buffer/template layers of the invention possess a wide range of tunable lattice parameters, as shown in FIG. 1, and exhibit superior microstructural quality as well as unique morphological and physical characteristics that make them perfect candidates as templates for the subsequent growth of compound semiconductors at conditions compatible with conventional Si CMOS processing.

Figure 4:
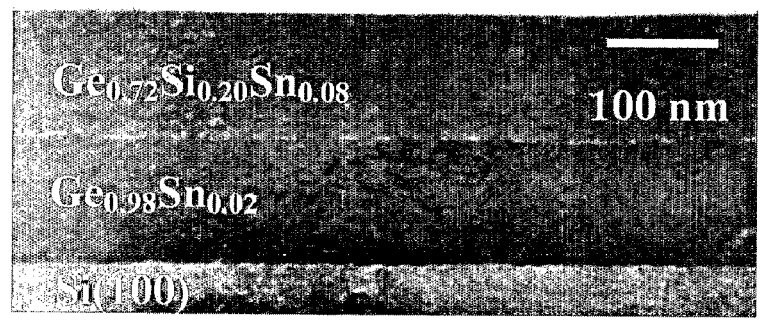
FIG. 4: XTEM of a typical GeSiSn/GeSn heterostructure on Si, showing a defect-free film and a smooth surface. The thickness of each layer is 100 nm and the lattice constant of the top layer is ~5.7 Å.

We have grown a host of device-quality SiGeSn samples with compositions ranging from 10-32 at. % Si and 1.0-11.0 at. % Sn and lattice dimensions that might be suitable for II-IV integration. We have achieved strained (tensile) as well as relaxed and lattice-matched SiGeSn films on GeSn buffer layers depending on film thickness and lattice constants of the SiGeSn/GeSn heterostructure. FIG. 4 shows a TEM micrograph of a lattice-matched system with a highly commensurate microstructure including smooth, sharp and defect-free interfaces. XTEM studies of these systems invariably reveal uniform and highly planar GeSiSn films exhibiting few threading defects. The crystal structure, elemental distribution, morphological and bonding properties of the SiGeSn/GeSn heterostructures have been well characterized by TEM, including nanoscale EELS, high resolution XRD, AFM and Raman spectroscopy. Collectively, these techniques show perfectly epitaxial, uniform and highly aligned layers with atomically smooth surfaces and monocrystalline single-phase structures.

The Si—Ge—Sn system described herein provides unprecedented flexibility for lattice and thermal engineering that can theoretically span lattice constants from 5.4 to almost 6.5 Å, and allows an independent adjustment of the coefficient of thermal expansion in the range of $2.5-6.1 \times 10^{-6} K^{-1}$. Thus, it can be simultaneously perfectly lattice and thermally matched to III-V and II-VI compounds of interest. Current results demonstrate significant advantages over existing technologies, most notably one order of magnitude lower threading defect densities, the ability to absorb misfit and possibly thermal stress, and ease of preparation.

EXAMPLE 1

GeSn Surface Preparation And Examples of Si Integration

The GeSn buffer layer surface can be prepared by extremely simple chemical cleaning methods for subsequent ex-situ epitaxial growth. This is an essential enabling step that further demonstrates the feasibility of these materials as versatile templates for integration with Si. GeSn films with the desired thickness and Sn concentration are grown on Si substrates with a nominal size of 2.5×3.0 $cm^2$. A single typical deposition experiment produces a batch of 4-10 wafers. We routinely characterize several randomly selected samples from each batch using RBS (Rutherford backscattering spectroscopy), atomic force microscopy (AFM) and x-ray diffraction to evaluate the quality of the films. RBS ion channeling is used to gauge qualitative the presence of threading dislocations that propagate across the layer thickness. In most samples, the ratio of the aligned versus the random peak heights ($_{\chi min}$), which measures the degree of crystallinity, decreases from 10% at the interface to 5% at the surface, indicating a reduction in dislocation density across the thickness of the film. The 5% value approaches the practical limit of ~3% for a perfect Si crystal and indicates that most of the defects are concentrated at the interface, while the top portion of the film is virtually defect free (as verified by high resolution XTEM (Cross sectional transmission electron microscopy). A minimum film thickness of 50 nm is needed to obtain defect levels approaching the $10^6/cm^2$ value. Only samples that display RBS $_{\chi min}$ channeling of ~5-6%, RMS roughness of less than 1 nm and XRD rocking curves with FWHM of less than 0.2 degrees are utilized for subsequent growth. A post-growth annealing step reduces further the concentration of threading defects and improves the mosaic spread of the crystal as evidenced by a dramatic reduction of the FWHM (full width at half maximum) of the (004) rocking curve. This step is preferable for obtaining suitable template growth on Si.

The characterized templates are cleaned in acetone, isopropanol and methanol ultrasonic baths and then loaded in the growth chamber and outgased at 350° C. until the pressure reached the base value of $5 \times 10^{-10}$ Torr. The substrate surface morphology and structure are examined by LEED (low energy electron diffraction) and LEEM (low energy electron microscopy) with a low-energy electron microscope operating up to 50 eV. The LEEM images show that the phase-contrast of the layer surface is uniform indicating a highly planar surface morphology for a 15 μm field of view. The corresponding LEED images of the sample show sharp and well-defined (1×1) diffraction patterns indicating that the surface reconstruction is well ordered and free of impurities. LEED is particularly sensitive to the presence of chemical surface impurities due to the low penetration depth of 10 Å. GeSn samples with concentration of at least 5 at % Sn can also be flashed for a brief period of ~2 seconds at 800° C. to remove any remaining surface impurities. The flashing of the sample improves the morphology and structure of the surface without any degradation of the bulk material.

EXAMPLE 2

Examples Of Growth Of III-V Materials On Si Via Si—Ge—Sn Buffer Layers: GaAs, AlGaAs, GaAsSb and InGaAs As a demonstration of the applicability of the GeSn film as buffer layers for integration of semiconductors with Si we explored direct growth of III-V compounds on GeSn/Si substrates. We grew pure GaAs (a=5.65 Å) layers as well as AlGaAs/GaAs quantum well structures on nearly lattice-matched GeSn (a=5.67 Å) buffer layers. For comparison we simultaneously conducted growth of the same materials on GaAs substrates via homoepitaxy. In both cases we have determined the structural, morphological and optical properties of the films by XTEM, AFM, photoluminescence (PL), and high resolution XRD. We find that the quality of the films grown on GaAs substrates (including PL peak positions) is comparable to that grown on GeSn/Si buffer layers indicating that our methodology in this case works and our approach may offer a convenient and low cost route to the integration of compound semiconductors with Si.

Figure 5:
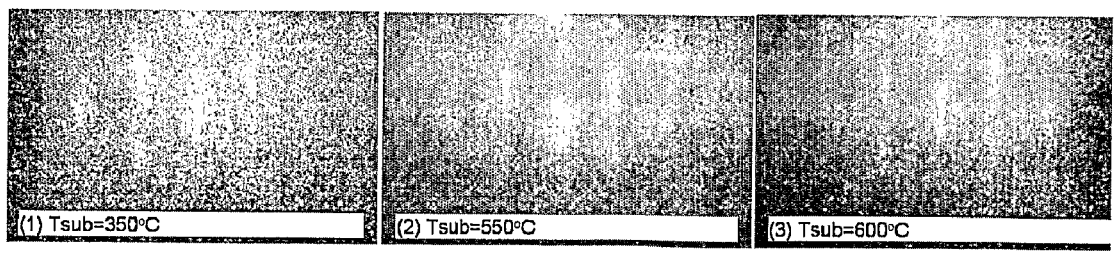
FIG. 5. Evolution of RHEED patterns for a $Ge_{0.98}Sn_{0.02}$ during the thermal treatment from 350 to 600° C. at UHV conditions.

The growth was conducted by MBE. The GeSn buffer layers on Si(100) were prepared and characterized ex situ, prior to use as described above. The sample was heated in the MBE chamber up to 600° C. and the structure of the (100) surface was monitored by RHEED. The data are resented in FIG. 5, which shows a sequence of RHEED patters obtained at 350, 550 and 600° C. (left, middle and right panels, respectively). The results indicate that reconstruction of GeSn surface can be obtained at 350° C. As the temperature increases to 600° C. the diffraction maxima become much sharper is observed indicating that the film surface is flat and crystallographically ordered thus fully prepared for subsequent epitaxial growth.

Figure 6:
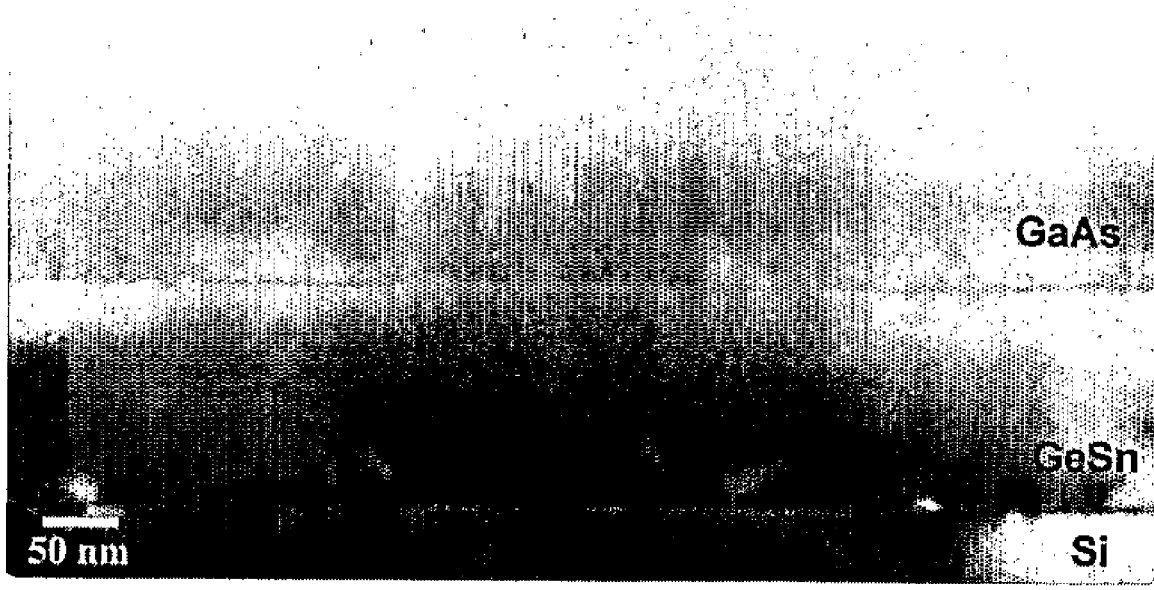
FIG. 6. XTEM micrograph of pure GaAs grown on a GeSn buffer layer
Figure 7:
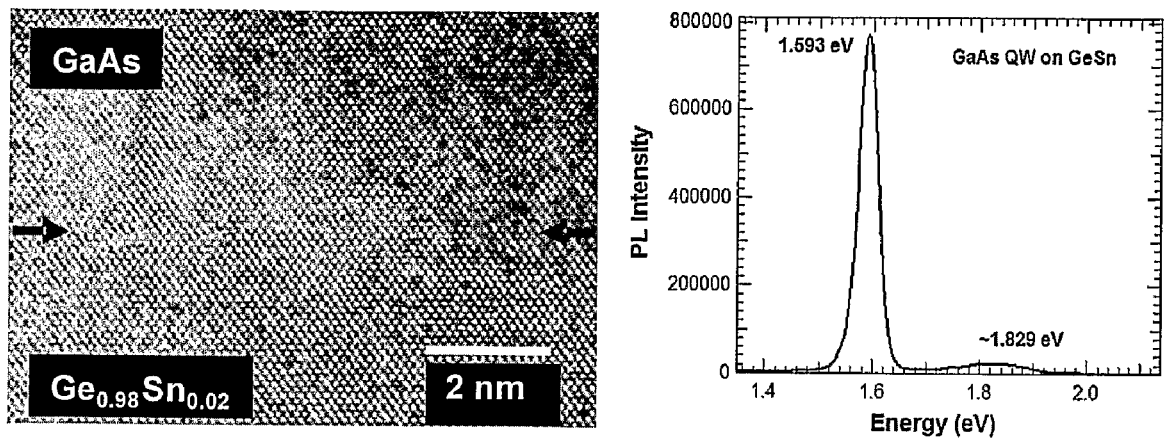
FIG. 7. (left) High resolution XTEM micrograph showing a clean epitaxial GaAs/GeSn interface marked by arrows. (right) PL of a GaAs quantum well. The weak peak at 1.827 eV corresponds to the AlGaAs barrier FIG. 8. RBS random and channeled spectra of $In_{0.10}Ga_{0.90}As$ on $Ge_{0.95}Sn_{0.05}$ Note that all constituent elements in the film channel remarkably well FIG. 9. XRD RSM maps of the (224) reflections of $In_{0.10}Ga_{0.90}As$ and $Ge_{0.95}Sn_{0.05}$ relative to the Si peak showing that the corresponding in plane parameters (a) are virtually identical, $(Q_x=\lambda\sqrt{8}/2a)$. Note that the GeSn and InGaAs (224) peaks fall directly on the line connecting the Si peak to the origin consistent with a relaxed film.

The III-V layers were grown at 600° C. The surface morphology of films grown on both Si/GeSn and GaAs substrates is planar with AFM RMS values ~1 nm. The film crystallinity grown on GeSn buffer layers is of extremely high quality as shown in FIG. 6. The microstructure is perfectly epitaxial and shows sharp, defect free interfaces between the various layers. FIG. 7 shows a high resolution XTEM micrograph of the GaAs/Ge$_{0.98}$Sn$_{0.02}$ interface for a quantum well stack comprised a Ge$_{0.98}$Sn$_{0.02}$/GaAs/AlGaAs/GaAs (quantum well) /AlGaAs heterostructure. The interface is perfectly commensurate and defect free with no sign of contaminants indicating that our ex situ preparation methodologies have indeed produced a perfectly clean growth surface. FIG. 7 also shows the PL spectrum of the same sample.

References for Examples 1 and 2
1. M. Bauer, J. Taraci, J. Tolle A. V. G Chizmeshya, S. Zollner, J. Menendez, D. J. Smith and J. Kouvetakis, "Ge$_{1-x}$Sn$_x$ semiconductors for bandgap and lattice engineering," Appl. Phys. Lett., 81, 2992-2994 (2002).
2. A. V. G Chizmeshya, M. Bauer, and J. Kouvetakis, "Experimental and theoretical study of deviations from Vegards Law in the Ge$_{1-x}$Sn$_x$ system," Chem. of Matls., 15, 2511-2519 (2003).
3. M. Bauer, Cole Ritter, Peter Crozier, J. Menendez, Jie Ren, and J. Kouvetakis, "Synthesis of ternary Si—Ge—Sn semiconductors on Si(100) via Sn$_x$Ge$_{1-x}$ buffer layers," Appl. Phys. Lett., 83(9), 216-2165 (2003).
4. M. Bauer, Peter Crozier, A. V. G Chizmeshya and J. D. Smith and J. Kouvetakis, "GeSn superstructured materials for Si-based optoelectronic technology," Appl. Phys. Lett., 83, 3489-3491 (2003).
5. P. Aella, C. Cook, J. Tolle S. Zollner, A. V. G. Chizmeshya and J. Kouvetakis, "Structural and optical properties of Sn$_x$Si$_y$Ge$_{1-x-y}$ alloys," Appl. Phys. Lett. 84, 888-890 (2004).
6. R. Roucka, J. Tolle, C. Cook, A. V. G. Chizmeshya, J. Kouvetakis, V. D'Costa, J. Menendez, Z. D. Chen, and S. Zollner, "Versatile buffer layer architectures based on Ge$_{1-x}$Sn$_x$ alloys," Appl. Phys. Lett. 86(19), 191912-191914 (2005).
7. G. He and H. Atwater, "Synthesis of epitaxial Sn$_x$Ge$_{1-x}$ alloy films by ion-assisted molecular beam epitaxy," Appl. Phys. Lett. 68(5), 664-666 (1996).

EXAMPLE 3

Integration Of InGaAs and GaAsSb With Si Via Lattice Engineered GeSn Buffer Layers Introduction Semiconductor laser diodes, such as vertical-cavity surface-emitting lasers (VCSELs) operating in the telecommunications wavelength range, between approximately 1.25 μm and 1.56 μm, are desirable for low cost optical telecommunication systems and data links. Realization of these devices may enable digital communications applications such as "fiber to the home," which operate over distances of only a few kilometers.

Furthermore, long-wavelength lasers require low operating voltages, making them attractive for integration with monolithic Si-based circuitry in which the trend has been toward reducing the operating voltages and obtaining higher integration density.

Traditionally, indium phosphide (InP) has been the substrate of choice for edge emitting lasers. However, the InP material system has limitations that can affect the performance of devices formed on this substrate. In order to ensure reliability and reproducibility, as well as to overcome the limitations of the InP/InGaAsP material system, there is has been interest in developing alternative structures based on GaAs, especially since GaAs-based technology is generally more advanced than that of InP. GaAs offers advantages in terms of lower substrate cost and potentially improved device performance. However, it is not straightforward to find materials that can be grown on GaAs with band-gaps that are suitable for long wavelength (approximately 1.3 μm-1.6 μm) optoelectronic devices.

Whereas GaAs may offer significant advantages in terms of lower substrate cost, simpler crystal growth technology and higher reflectivity mirrors, the problem of growing high optical quality active material on GaAs is a problem that many researchers have attempted to tackle in numerous ways.

Materials that have been investigated include the ternaries InGaAs and GaAsSb, as well as "dilute nitrides" of the form InGaNAs and InGaNAsSb.

A problem with the growth of InGaAs on GaAs is the high strain due to the lattice mismatch between the two materials. Consequently, it is difficult to produce InGaAs lasers beyond approximately 1.2 μm. Above this wavelength, the gain of the material decreases rapidly. Nevertheless materials with lasing properties closer to 1.3 μm have been reported but their performance has been found unsuitable for practical use. In highly strained epitaxial growth, the layers do not grow smoothly, even well below their critical thickness. Layers can show surface roughness, corrugation or even formation of islands in the form of quantum-dots.

An alternative structure for lasers is based on GaAsSb quantum wells. These devices also face a strain issue, but their optical gain performance at wavelengths closer to 1.3 μm is superior to that of InGaAs, when pseudomorphically grown on GaAs substrates. However, one disadvantage of this material system is that the valence band offset of the antimonide structures is typically much larger than for InGaAs structures, limiting the number of quantum wells that can be grown and hence the gain achievable.

For these reasons, telecommunications wavelength lasers are typically grown on InP, using InGaAs active materials as opposed to antimonide-based active materials.

The ability to tailor the lattice constant of a Si—Ge—Sn buffer on a silicon substrate can allow lattice constants larger than that of GaAs to be achieved for the subsequent growth of pseudomorphic materials. The increased lattice constant allows higher indium content InGaAs layers to be grown (as well as higher quality lower-strain GaAsSb materials), allowing the possibility of telecommunications-wavelength operation with much improved performance when compared to similar structures grown on GaAs. Additional layers (waveguiding, cladding, contact layers, etc) required by such devices (typically based on InGaAlAs materials) can also be grown with high quality.

The GaAs$_{1-x}$Sb$_x$ System

The GaAs$_{1-x}$Sb$_x$ alloy system covers a wide range of lattice parameters and direct bandgaps between those of GaSb (6.096 Å, 0.726 eV) and GaAs (5.65 Å, 1.43 eV). This system also includes the communication wavelength range between 1.3-1.55 μm corresponding to x=0.35-0.48. Additionally, the high electron mobility makes GaAs$_{1-x}$Sb$_x$ very attractive material for optoelectronic applications. Growth of relaxed $GaAs_{0.50}Sb_{0.50}$ can be conducted on lattice matched InP substrates. Mismatched $GaAs_{1-x}Sb_x$ alloys can be grown as strained layers on highly mismatched GaAs and InP wafers [1] or as compositionally graded films, in which the strain is relieved through dislocations with thickness [2].

Recent research based on $GaAs_{1-x}Sb_x$ ternary alloys has mainly concentrated on the following device structures: (1) dual heterostructure bipolar transistors (DHBT) grown by MBE and MOCVD on InP substrates operating at 300 GHz [3]. (2) Vertical cavity surface emitting lasers (VCSELs) based on type-II GaAsSb/InGaAs QWs operating at 1.3 μm [4]. GaAsSb/GaAs VCESLs are currently new alternative to AlGaAs/GaAs due to their electrical properties [5] (3) lattice-matched $GaAs_{0.50}Sb_{0.50}$/InP photodiodes for applications at 1.55 μm [6] (4) Resonant cavity enhanced p-i-n photodiodes with 54% quantum efficiency at 1.3 μm [7].

References:
[1] Growth of strained GaAsSb layers on GaAs (001) by MOVPE, Pristovsek M., Zorn M., Zeimer U., Weyers M., Journal of Crystal Growth 276(3-4), 347-353 (2005).
[2] Deep levels caused by misfit dislocations in GaAsSb/GaAs heterostructures, Wosinski A., Makosa A., Figielski T., Raczynska J., Appl. Phys. Lett. 67(8), 1131-1133 (1995).
[3] 300 GHz InP/GaAsSb/InP double HBTs with high current capability and BVCEO <6 V, Dvorak M. W., Bolognesi C. R., Pitts O. J., Watkins S. P, IEEE Electron Device Letters 22(8), 361-363 (2001).
[4] Optical characterization and determination of conduction band offset of type-II GaAsSb/InGaAs QW, Ryu Sang-Wan, Dapkus P. D., Semiconductor Science and Technology 19(12), 1369-1372 (2004).
[5] Long wavelength GaAsP/GaAs/GaAsSb VCSELs on GaAs substrates for communications applications, Dowd P., Johnson S. R., Feld S. A., Adamcyk M., Chaparro S. A., Joseph J., Hilgers K., Horning M. P., Shiralagi K., Zhang Y.-H., Electronics Letters 39(13), 987-988 (2003).
[6] Demonstration of High-Speed Staggered Lineup GaAsSb-InP Unitraveling Carrier Photodiodes, Liguang Zheng, Xiong Zhang, Yuping Zeng, S. R. Tatavarti, S. P. Watkins, C. R. Bolognes,Stéphane Demiguel, and J. C. Campbell, IEEE Photonics Technology Letters, 17(3), 651 (2005).
[7] GaAsSb: a novel material for near infrared photodetectors on GaAs substrates, Xiaoguang Sun, Shuling Wang, Hsu J. S., Sidhu R., Zheng X. G., Xiaowei Li, Campbell J. C., Holmes A. L. Jr., Selected Topics in Quantum Electronics, IEEE Journal of Volume 8, Issue 4, 817-822 (2002).

Growth of GaAsSb on Si substrates for monolithic integration with Si electronics appears to be an unexplored area of research, due to the large lattice and thermal mismatch between the alloys and the substrate. We have recently employed our Ge—Sn buffer layer approach to grow for the first time lattice matched and relaxed $GaAs_{1-x}Sb_x$ films on Si(100) substrates. Epilayers with x up to 0.18 were grown on $Ge_{1-x}Sn_x$ with x=0-0.07. In addition we have also obtained higher concentrations of mismatched $GaAs_{1-x}Sb_x$ systems covering the telecommunications wavelengths.

InGaAs Experimental

In this study we have applied our new method to the growth of $In_xGa_{1-x}As$ alloys with a wide range of variable and controllable compositions. Lattice matched, fully strained (tensile, compressive) and strain-free $In_xGa_{1-x}As$ films are grown on $Ge_{1-x}Sn_x$ with x=0-0.08. This range covers lattice parameters between that of GaAs (5.65 Å) and InP (~5.83 Å) and in principle can be used to lattice match a wide range of $In_xGa_{1-x}As$ composition with In contents up to x=0.45.

The buffer layer used in this study were grown ex situ using RCA cleaned Si(100) substrates in a hot wall UHV-CVD reactor by reactions of gaseous digermane $Ge_2H_6$ and perdeuterated stannane $SnD_4$. Appropriate concentrations of the reactants were initially combined in the gas phase and were diluted by hydrogen to establish a homogeneous mixture and to facilitate uniformity of mass flow into the reactor. A large excess of hydrogen was used as carrier gas as described elsewhere. After growth, the buffer layers were thoroughly examined by random RBS to determine the composition and thickness and by ion channeling block experiments to evaluate the degree of epitaxial alignment. High resolution XRD was then used to measure the exact in plane lattice parameter (a) of the cubic structure. $Ge_{1-x}Sn_x$ buffer layers with x=0.02-0.08 and corresponding lattice parameters between 5.66 and 5.73 Å were used for subsequent growth. Prior to growth the $Ge_{1-x}Sn_x$ films were annealed in situ at 550° C. under nitrogen for 15 minutes. This further improved the layer microstructure, yielded a substantial reduction in overall defect concentration and ensured full relaxation with respect to the substrate. The XRD data of the annealed films revealed a three fold increase in lateral grain size and a concomitant decrease in mosaic spread. XTEM observations confirmed a substantial improvement in crystallinity. The AFM RMS roughness was between 0.5-0.7 nm indicating virtually atomically flat buffer layer surfaces.

To evaluate the feasibility of the $Ge_{1-x}Sn_x$ films as buffer layers for the epitaxial growth of InGaAs semiconductors we have employed a conventional route typically utilized in the commercial production of this material. The InGaAs films were grown in a horizontal low-pressure, cold-wall reactor using an inductively heated molybdenum block susceptor. Freshly synthesized and purified MOCVD precursors $Ga(CH_3)_3$ (trimethylgallium, TMGa), $In(CH_3)_3$ (trimethylindium, TMIn) and $AsH_3$ (arsine) were used for growth of InGaAs films. Stock mixtures of $Ga(CH_3)_3$ and $AsH_3$ with hydrogen in 1:10 and 1:15 ratios, respectively were carefully prepared and kept at room temperature. The relative reactant concentrations during deposition were regulated by mass flow controllers. To establish a uniform flow of the indium species, the $In(CH_3)_3$ compound was dispensed from a bubbler containing solid material kept between −5 and +5° C. A controlled amount of hydrogen carrier gas was allowed to flow through the materials in the bubbler. The relative concentration of $In(CH_3)_3$ in vapor phase was controlled by the temperature of the bubbler which in turn determined the In concentration of the film.

Prior to growth the silicon wafers with the GeSn buffer layers were sonicated in methanol for 5 minutes to remove any organic contaminants and the Ge oxidized surface layer. After drying the samples by blowing nitrogen over the surface, the substrates were quickly transferred into the reaction chamber through a load lock at $10^{-8}$ Torr. $AsH_3$ was flown over the samples at 450° C. to remove any residual contaminants from the surface. The desired growth temperature was established (500-540° C.) and then appropriate concentrations of $AsH_3$, TMGa and TMIn were simultaneously allowed to react on the substrate surface. High purity nitrogen was used as the main carrier gas during the reaction, which was conducted 5 Torr pressure. The maximum reaction temperature was 540° C. to ensure that the high Sn content (>10%) GeSn buffer layers remain stable. The $AsH_3$ and III-metalorganic partial pressures were approximately equal during growth. The In content was adjusted by the temperature of the bubbler and the flow rate of the $H_2$ carrier gas over the solid In(CH$_3$)$_3$ sample. The deposited films were slowly cooled to room temperature under a continuous flow of AsH$_3$ to prevent evaporation of As from the surface layers. Under these conditions, films with smooth morphology were grown (no evidence of In or Ga metal droplets or surface pits were detected in the AFM images). The samples were thoroughly analyzed by RBS, XTEM, HRXRD, Raman spectroscopy and photoluminescence and the results are described below.

Results:

In this study we have primarily focused on growth of In$_x$Ga$_{1-x}$As alloys with In concentrations that give band gap emission close to the desired communications range of 1.33-1.55 μm. This corresponds to $a_{InGaAs}$=5.77-5.81 Å and x=0.35-0.48, respectively, based on Vegard's law. A series of alloys with In concentration up to x=0.40 have been grown on Ge$_{1-x}$Sn$_x$ (x=0,02-0,07) buffer layers. These include lattice matched and mismatched samples and coherent layers that are either tensile or compressively strained.

Figure 8:
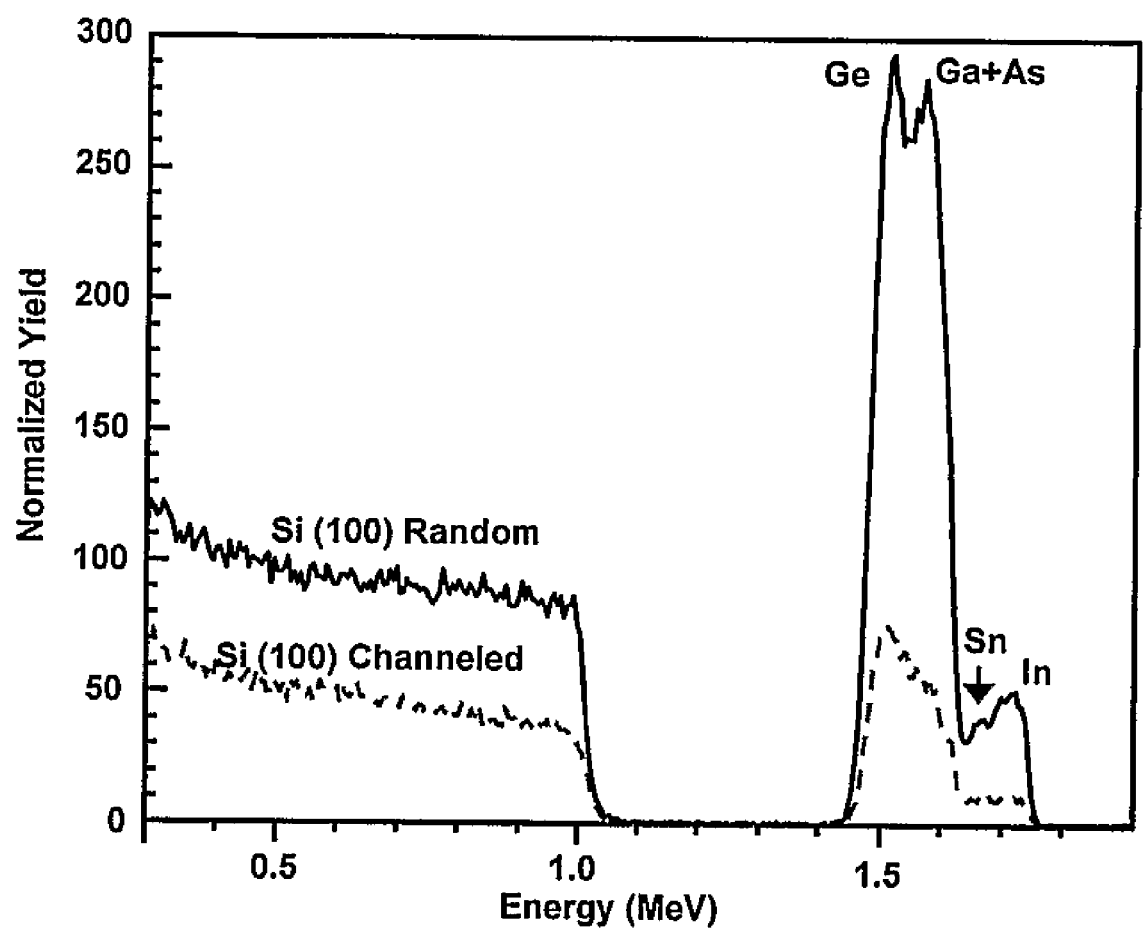
Figure 9:
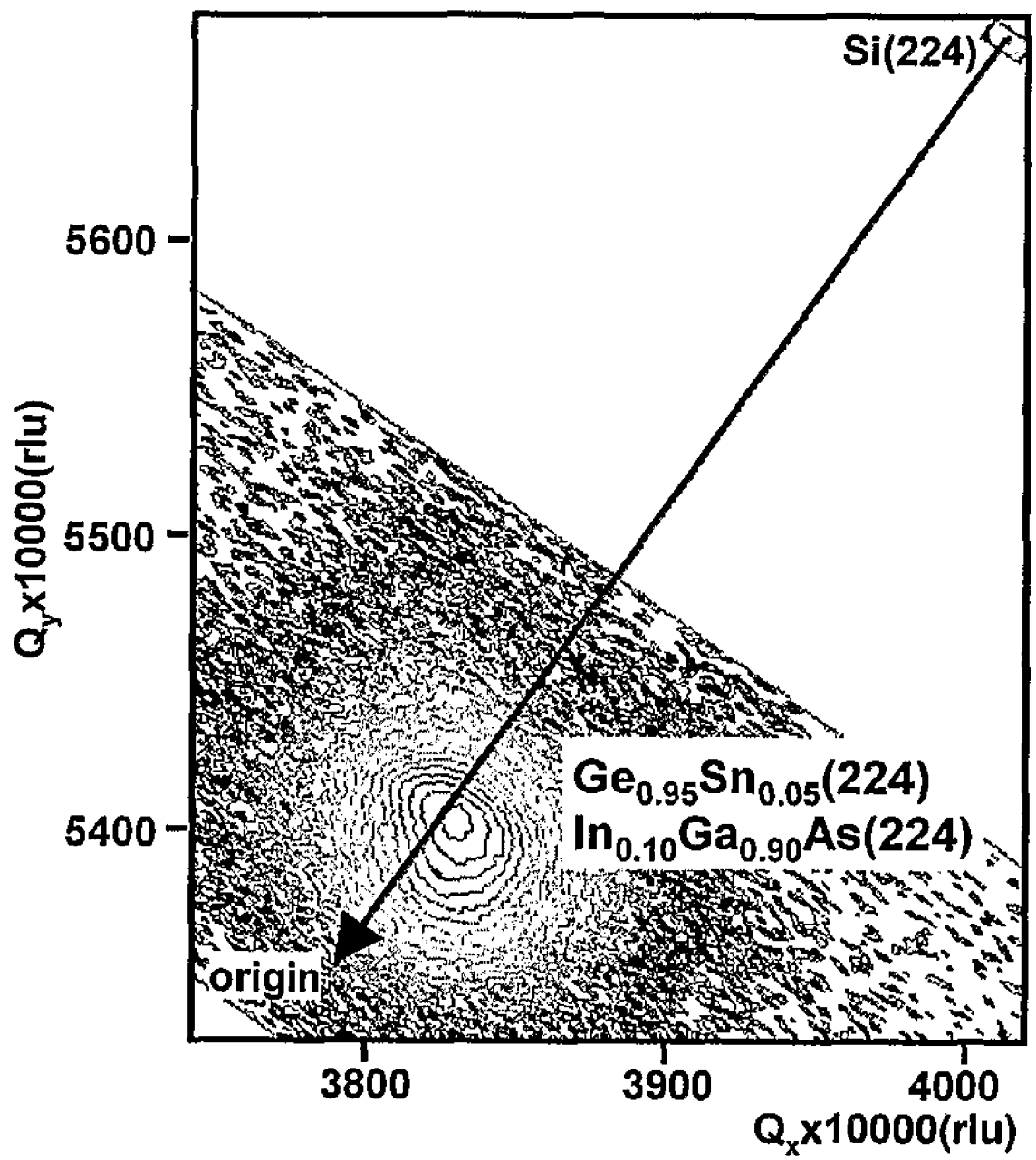

FIG. 8 shows the RBS spectra of a typical lattice matched In$_x$Ga$_{1-x}$As film grown on a Ge$_{1-x}$Sn$_x$ buffer. The random spectrum (black trace) comprises overlapping peaks corresponding to the Ge, Ga, As, Sn and In RBS signals. A fitting procedure using the known composition and thickness of the buffer layer (Ge$_{0.95}$Sn$_{0.05/70}$ nm) revealed that the corresponding thickness and elemental content of the film are 170 nm and In$_{0.10}$Ga$_{0.90}$As, respectively. The ion channeling spectrum (red trace) shows a high degree of crystallinity and epitaxial alignment between the film, the buffer and the underlying Si(100) substrate. These data also confirm that the entire Sn content of the Ge$_{0.95}$Sn$_{0.05}$ layer remains substitutional and that the constituent elements In, Ga and As of the film occupy the same cubic lattice indicating single phase material. FIG. 9 shows a high resolution XRD reciprocal space map of the (224) Bragg reflections for the entire heterostructure including the Si substrate. Note the complete overlap of the (224) peaks of Ge$_{0.95}$Sn$_{0.05}$ and In$_{0.10}$Ga$_{0.90}$As indicating that the lattice parameters for both layers are nearly identical. Precise determination of the lattice parameters using the (004) and (224) high resolution XRD measurements give $a_{GeSn}$=5.689 Å and $c_{GeSn}$=5.698 Å and $a_{InGaAs}$=5.70 Å and $c_{InGaAs}$=5.705 Å. These data show that the layers are strain free and nearly lattice matched. Note that the line connecting the Si (224) peak with the origin passes directly through the center of the (224) peaks of Ge$_{0.95}$Sn$_{0.05}$ and In$_{0.10}$Ga$_{0.90}$As confirming the fully relaxed state of the stack with respect to the Si substrate. The growth results of this study show that a typical Ge$_{0.95}$Sn$_{0.05}$ buffer layer which can be produce on a routine basis in nearly perfect crystallinity and morphological quality can readily accommodate growth of lattice matched In$_x$Ga$_{1-x}$As layers with nominal In concentrations of x=0.09-0.11.

Films with In content x<0.10, in the range of 0.03-0.09, grown on Ge$_{0.95}$Sn$_{0.05}$ were found to be completely crystalline and epitaxial with relatively low concentrations of threading defects. High resolution XRD data showed that the buffer layers in all cases were essentially relaxed and the In$_x$Ga$_{1-x}$As films were fully coherent and tensile strained with the buffer as expected due to the lattice mismatch.

Figure 10:
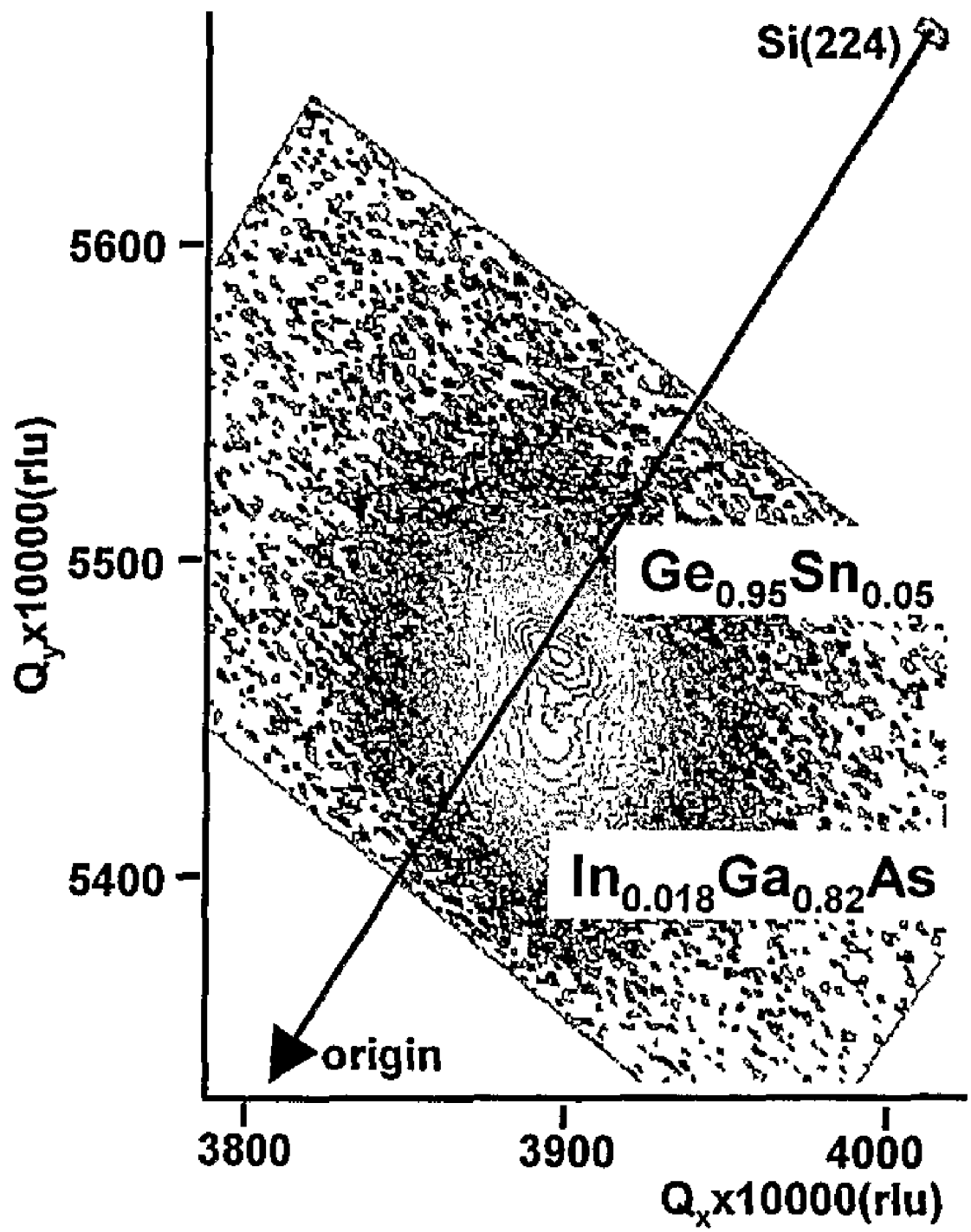
FIG. 10. XRD RMS maps of the (224) reflections of $In_{0.18}Ga_{0.82}As$ and $Ge_{0.95}Sn_{0.05}$ showing that the corresponding in plane parameters (a) are identical, $(Q_x=\lambda\sqrt{8}/2a)$. Note that the GeSn and GeSiSn (224) peaks fall directly on the line and below the line connecting the Si peak to the origin, respectively, consistent with a relaxed buffer and a compressive film.
Figure 11:
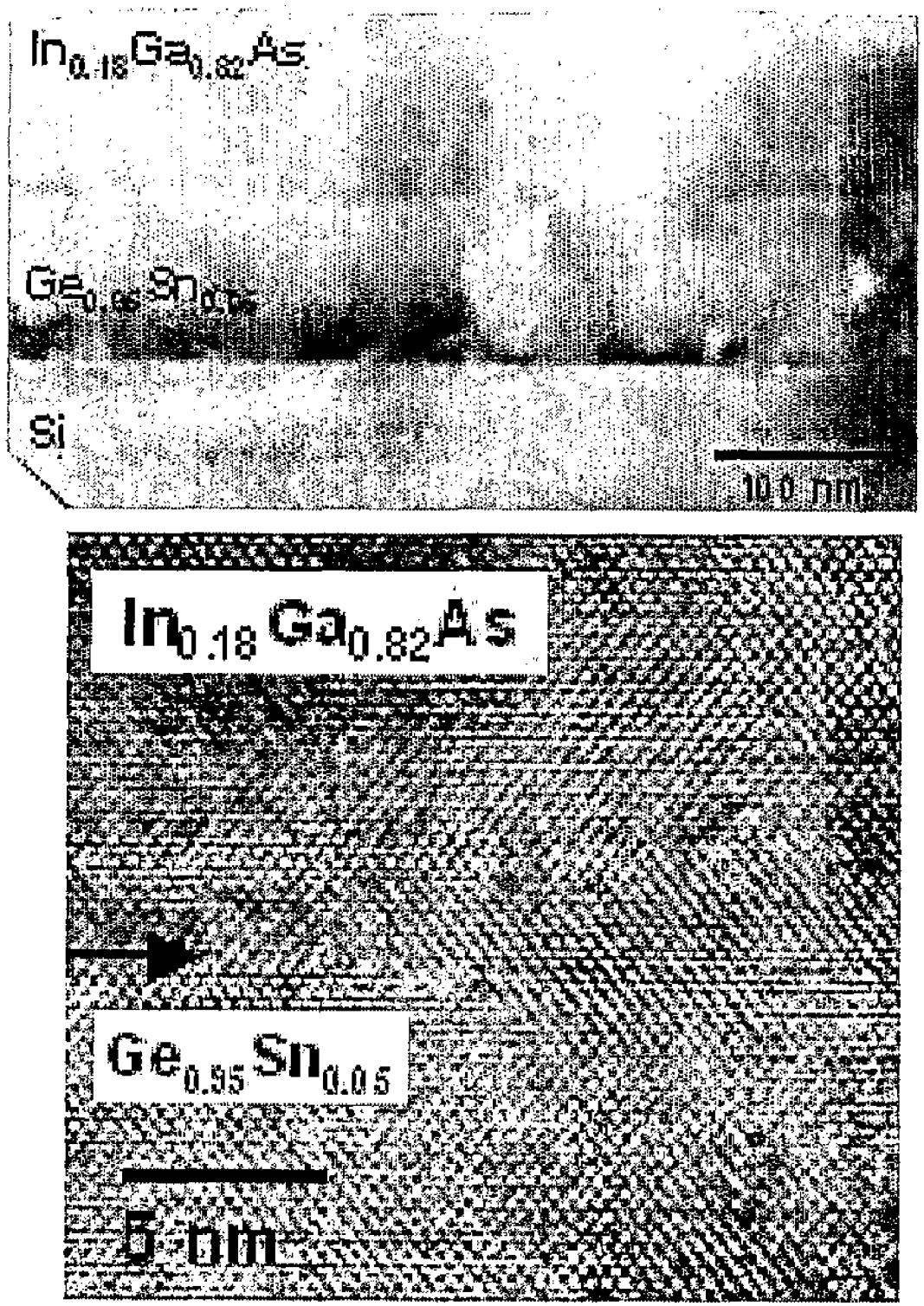
FIG. 11 (top). Bright field XTEM micrograph of $In_{0.18}Ga_{0.82}As$ on $Ge_{0.95}Sn_{0.05}$. (bottom) High resolution image of the buffer/film interface.

Films in the range of x=0.11-0.20 were also synthesized on the same Ge$_{0.95}$Sn$_{0.05}$ templates and were found to be fully coherent and compressively strained. XRD analysis including on-axis (004) and asymmetric 224 reciprocal space map measurements were used extensively to determine the horizontal (a) and the vertical (c) lattice dimensions and characterize the strain state of the films. FIG. 10 shows the (224) peaks for a compressively strained In$_{0.18}$Ga$_{0.82}$As epilayer grown on a relaxed buffer. The (224) reflection of In$_{0.18}$Ga$_{0.82}$As lies exactly below the buffer layer peak indicating that in-plane lattice constants are nearly the same, $a_{GeSn}$=5.703 Å and $a_{InGaAs}$=5.696 Å. The corresponding vertical dimensions are $c_{GeSn}$=5.698 Å and $c_{InGaAs}$=5.738 Å. In addition the buffer layer peak lies directly on the line passing through the origin confirming its full relaxation. XTEM analysis indicated single-phase layers in high epitaxial alignment which is confirmed by XTEM observations. FIG. 11 shows high bright field micrographs of the entire In$_{0.18}$Ga$_{0.82}$As/Ge$_{0.95}$Sn$_{0.05}$/Si(100) film and high resolution images of the epilayer-buffer interface. The data demonstrate high quality layer microstructure and morphology including, sharp, defect free interfaces, planar surfaces and low concentrations of threading defects. Occasional dislocations propagating to the surface are observed in the XTEM bright field images. We note that we have not observed any anti-phase domain boundaries in any our In$_x$Ga$_{1-x}$As samples, which are common defects in MBE grown III-V semiconductors on nonpolar substrates like Ge or Si. This represents an important advantage of our CVD growth on Ge$_{1-x}$Sn$_x$ templates. AFM studies of the samples confirmed the smooth surface morphology with RMS values as low as 1.8 nm.

Figure 12:
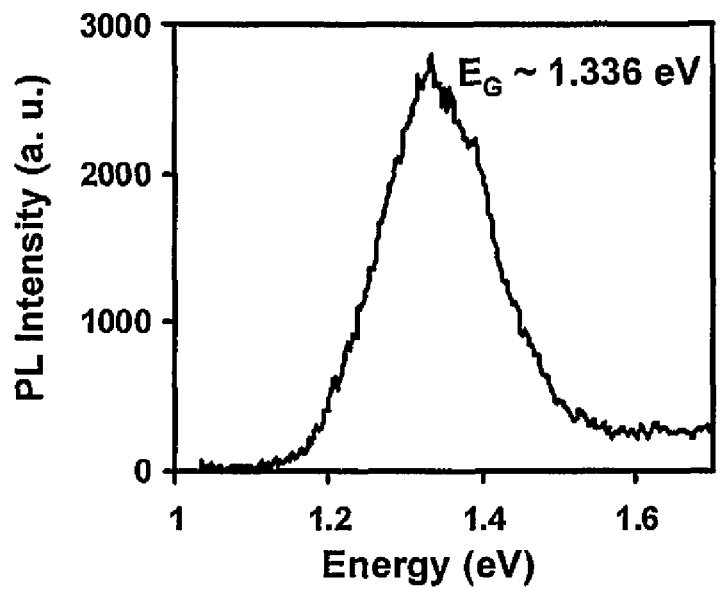
FIG. 12. Photoluminescence spectra of $In_{0.18}Ga_{0.82}As$ on a $Ge_{0.95}Sn_{0.05}$ buffer layer.

These samples were further characterized by Raman and photoluminescence (PL). The Raman scattering spectrum of the In$_{0.18}$Ga$_{0.82}$As/Ge$_{0.95}$Sn$_{0.05}$/Si sample was recorded using a 514.5 nm a laser line. The signal is deconvoluted into several distinct peaks corresponding to the LO vibrational modes of Ga—As (287.19 cm$^{-1}$), LO In—As (238.57 cm$^{-1}$), TO Ga—As (263.82 cm$^{-1}$) and Ge—Ge like phonon modes at 297.54 cm$^{-1}$. The Ga—As and In—As peaks are shifted from the positions expected for relaxed In$_{0.09}$Ga$_{0.41}$As (Relaxed GaAs: LO~285.8 cm-1, TO~263.9 cm-1 and relaxed InAs: LO~237.5 cm-1, TO~235.2 cm-1) [12]. The Raman shifts can be rationalized by the expected compressive strain in the In$_{0.18}$Ga$_{0.82}$As epilayer. The Ge—Ge peak corresponds to the underlying Ge$_{0.95}$Sn$_{0.05}$ buffer layer. The photoluminescence (PL) spectrum is fully consistent with its compressive state of the film. As shown in FIG. 12 a strong PL peak appears 1.336 eV. This value is larger than expected from the energy gap (1.25 eV) of a completely relaxed In$_{0.18}$Ga$_{0.82}$As layer. The presence of PL in our samples suggests that our low temperature Ge$_{1-x}$Sn$_x$/Si buffer layer approach is a viable route for broad monolithic integration.

Next we conducted experiments aimed at increasing the In content in the In$_x$Ga$_{1-x}$As beyond the level of x=0.20 in order to achieve the desired concentrations for emission and absorption within the communications range (x=0.35-0.45). Although, the Ge$_{0.95}$Sn$_{0.05}$ buffers were perfectly suitable for growth of epitaxial materials with In contents up to x=0.20, larger lattice constants buffers are needed. Accordingly the next set of samples were grown on Ge$_{0.93}$Sn$_{0.07}$ with a relaxed lattice parameter a=5.72 Å. Smooth In$_x$Ga$_{1-x}$As films with concentrations in the range of interest (x=0.34-0.40 corresponding to 1.3 and ~1.5 μm) were grown.

Figure 13:
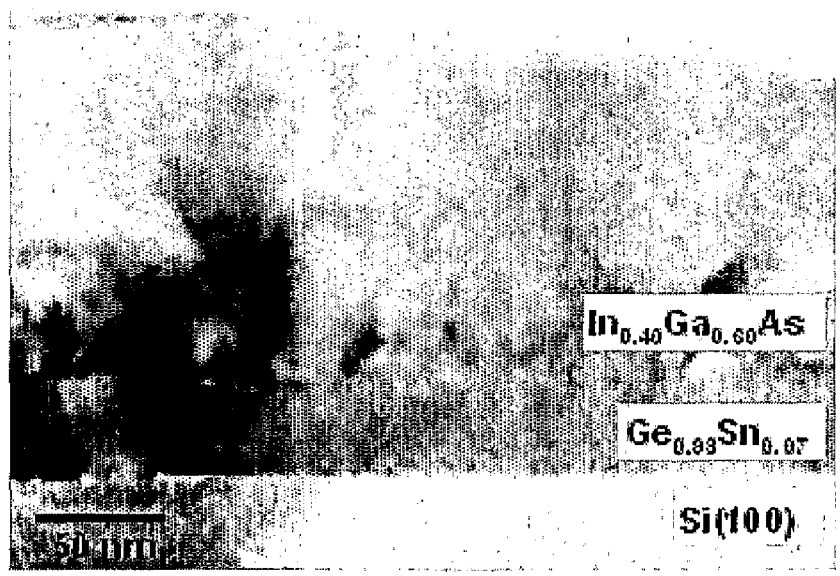
FIG. 13. Bright field XTEM micrograph of $In_{0.40}Ga_{0.60}As$ on $Ge_{0.93}Sn_{0.07}$.

The RBS spectrum of samples with a nominal composition In$_{0.40}$Ga$_{0.60}$As shows a slight gradient in the In content. This is a known problem and originates by accumulation of In atoms at the growth front in MOCVD and MBE processes. Another possible reason for the lower In content near the Ge$_{0.93}$Sn$_{0.07}$ interface may be due to the closer matching in lattice dimensions between the epilayer and the template [13]. The aligned RBS spectra of the sample revealed that both the Sn and Ge signals channeled the same indicating that the 7% Sn buffer layer remains stable during growth. XTEM bright field images (FIG. 13) showed a monocrystalline and virtually defect free epilayer and confirmed the presence of a perfectly intact buffer layer. Annealing of the sample at 550°

C. resulted in an overall improvement of the film microstructure including that of the buffer layer. The number of threading defects extending to the uppermost surface was dramatically reduced in both layers.

Sample with a nominal composition of $In_{0.34}Ga_{0.66}As$ grown on $Ge_{0.93}Sn_{0.07}$ also shows a gradient in the In content through the layer. The microstructural and morphological properties in these appear to be very similar to the $In_{0.40}Ga_{0.60}As$ film. Interestingly, in this case, the HR-XRD data indicate that the epilayer is compressively strained and perfectly coherent to the buffer ($a_{GeSn}$=5.71 Å and $a_{InGaAs}$=5.713 Å).

Figure 14:
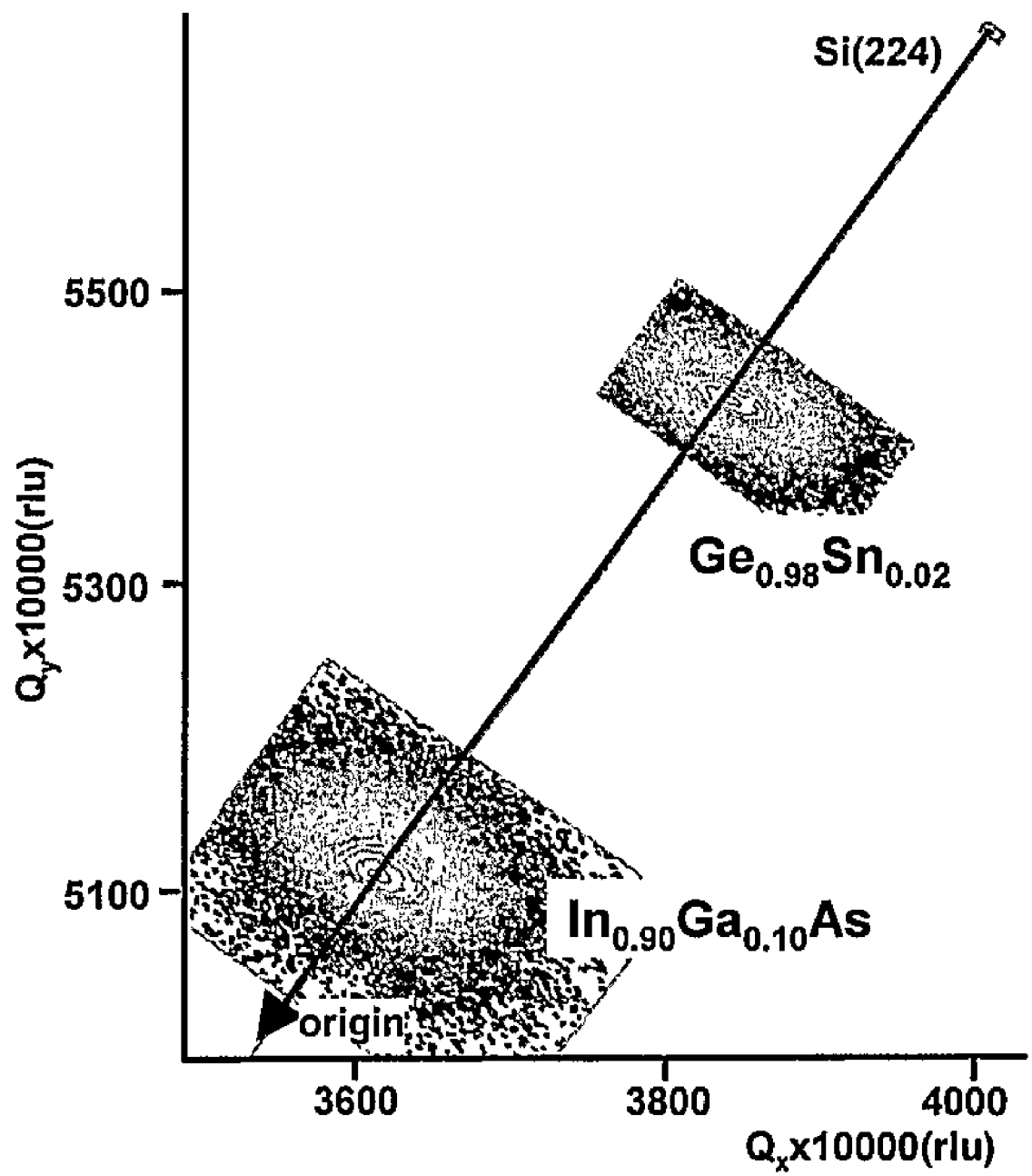
FIG. 14. XRD RMS maps of the (224) reflections of $In_{0.95}Ga_{0.05}As$ and $Ge_{0.98}Sn_{0.02}$ showing a highly mismatched and fully relaxed heterostructure.

Efforts to grow pure InAs on GeSn templates resulted in island growth and rough films. Nevertheless we were able to produce fully relaxed In rich layers that are perfectly crystalline and epitaxial as evidenced by RBS ion channeling experiments, XTEM examinations and XRD measurements. FIG. 14 shows the XRD (224) reciprocal space maps of a typical heterostructure based on the $In_{0.90}Ga_{010}As/Ge_{0.98}Sn_{0.02}/Si$. Note that despite the large lattice mismatch the layers in this sample are highly aligned, and the mosaic spread and grain size of the epilayer are comparable to that of the underlying buffer.

References for Example 3

[1] Resonant cavity enhanced InGaAs photodiodes for high speed detection of 1.55 µm infrared radiation, Kaniewski J., Muszalski J., Pawluczyk J., Piotrowski J., Proceedings of SPIE-The International Society for Optical Engineering (2005), 5783 (Pt. 1, Infrared Technology and Applications XXXI), 47-56.
[2] InGaAs-on-Si single photon avalanche photodetectors, Kang Y., Lo Y.-H., Bitter M., Kristjansson S., Pan Z., Pauchard A., Applied Physics Letters (2004), 85(10), 1668-1670.
[3] High Performance 0.1 µm GaAs Pseudomorphic High Electron Mobility Transistors with Si Pulse-Doped Cap Layer for 77 GHz Car Radar Applications, Kim S., Noh H., Jang K., Lee J., Seo K., Jpn. J. App. Phys. 44, 2472-2475 (2005).
[4] Growth of AlAsSb/InGaAs MBE-layers for all-optical switches, Cristea P., Fedoryshyn Y., Jaeckel H., J. Cryst. Growth 278(1-4), 544-547 (2005).
[5] Improved characteristics of metamorphic InAlAs/InGaAs high electron mobility transistor with symmetric graded $In_xGa_{1-x}As$ channel, Li Y. J.; Hsu W. C.; Chen I-L.; Lee C. S.; Chen Y. J.; Lo I., J. of Vac. Sci. Tech. B 22(5), 2429-2433 (2004).
[6] Fabrication of 1.55 µm Si-Based Resonant Cavity Enhanced Photodetectors Using Sol-Gel Bonding, Mao R. W., Li C. B., Zuo Y. H., Cheng B. W., Teng X. G., Luo L. P., Yu J. Z., Wang Q. M., IEEE Photonics Technology Letters 16(8), (2004).
[7] Wafer-bonded InGaAs/silicon avalanche photodiodes, Pauchard A., Mages P., Kang Y., Bitter M., Pan Z.; Sengupta D., Hummel S., Lo Y. H., Yu P., Proceedings of SPIE-The International Society for Optical Engineering, 4650 (Photodetector Materials and Devices VII), 37-43 (2002).
[8] Residual strain and threading dislocation density in InGaAs layers grown on Si substrates by metalorganic vapor-phase epitaxy, Takano Y., Kururi T., Kuwahara K., Fuke S., Appl. Phys. Lett. 78(1), 93-95 (2001).
[9] Long wavelength room temperature laser operation of a strained InGaAs/GaAs quantum well structure monolithically grown by metalorganic chemical vapour deposition on a low energy-plasma enhanced chemical vapour deposition graded misoriented Ge/Si virtual substrate, Chriqui Y., Saint-Girons G., Isella G., von Kaenel H., Bouchoule S., Sagnes I., Optical Materials 27, 846-850 (2005).
[10] Comparison of luminescent efficiency of InGaAs quantum well structures grown on Si, GaAs, Ge, and SiGe virtual substrate, V. K. Yang, S. M. Ting, M. E. Groenert, M. T. Bulsara, M. T. Currie, C. W. Leitz and E. A. Fitzgerald. J. Appl. Phys. 93(9), 5095-5102 (2003).

$GaAs_{1-x}Sb_x$ System

Experimental

The growth study of $GaAs_{1-x}Sb_x$ ternary alloys on $Ge_{1-x}Sn_x$ buffer layers was performed via MOCVD utilizing $Ga(CH_3)_3$ (trimethylgallium TMGa), $Sb(CH_3)_3$ (trimethylantimony TMSb) and $AsH_3$ (arsine). The pure precursors were freshly prepared and then diluted with hydrogen in a 1:10 gas ratio and were kept at room temperature prior to use. The experiments were conducted using the same reactor as the $InGa_{1-x}As_x$ analogs at 5 Torr pressure and 510-560° C. depending on composition. The wafers were prepared ex situ as described previously and their surface was treated by $AsH_3$ prior to growth, in the reactor to remove any remaining contaminants. The initial experiments showed a depletion of Sb at the $Ge_{1-x}Sn_x/GaAs_{1-x}Sb_x$ interface. Therefore, TMSb was passed over the sample surface for 30 seconds at 5 Torr to build up an initial concentration of Sb species on growth front. Immediately thereafter TMGa and $AsH_3$ were allowed into the reactor to start the growth of the ternary. The flow rates of the reactants were judiciously adjusted to obtain the desired elemental contents. The composition of the $GaAs_{1-x}Sb_x$ films were controlled by the $TMSb:AsH_3$ flow ratio. A low $AsH_3$ partial pressure is needed to achieve reasonable Sb incorporation and the overall V/III ratio must also be kept at low levels. The ratio between the TMGa species and the combined TMSb and $AsH_3$ amount was varied from 1:1 to 1:5 to obtain a smooth surface without formation of undesirable metal droplets. Slow cooling under steady $AsH_3$ flow was necessary to prevent evaporation of As form the surface. Post growth characterizations for structure, composition, epitaxial alignment and surface morphology were conducted by RBS, XTEM, HRXRD and AFM and the results are described below.

Figure 15:
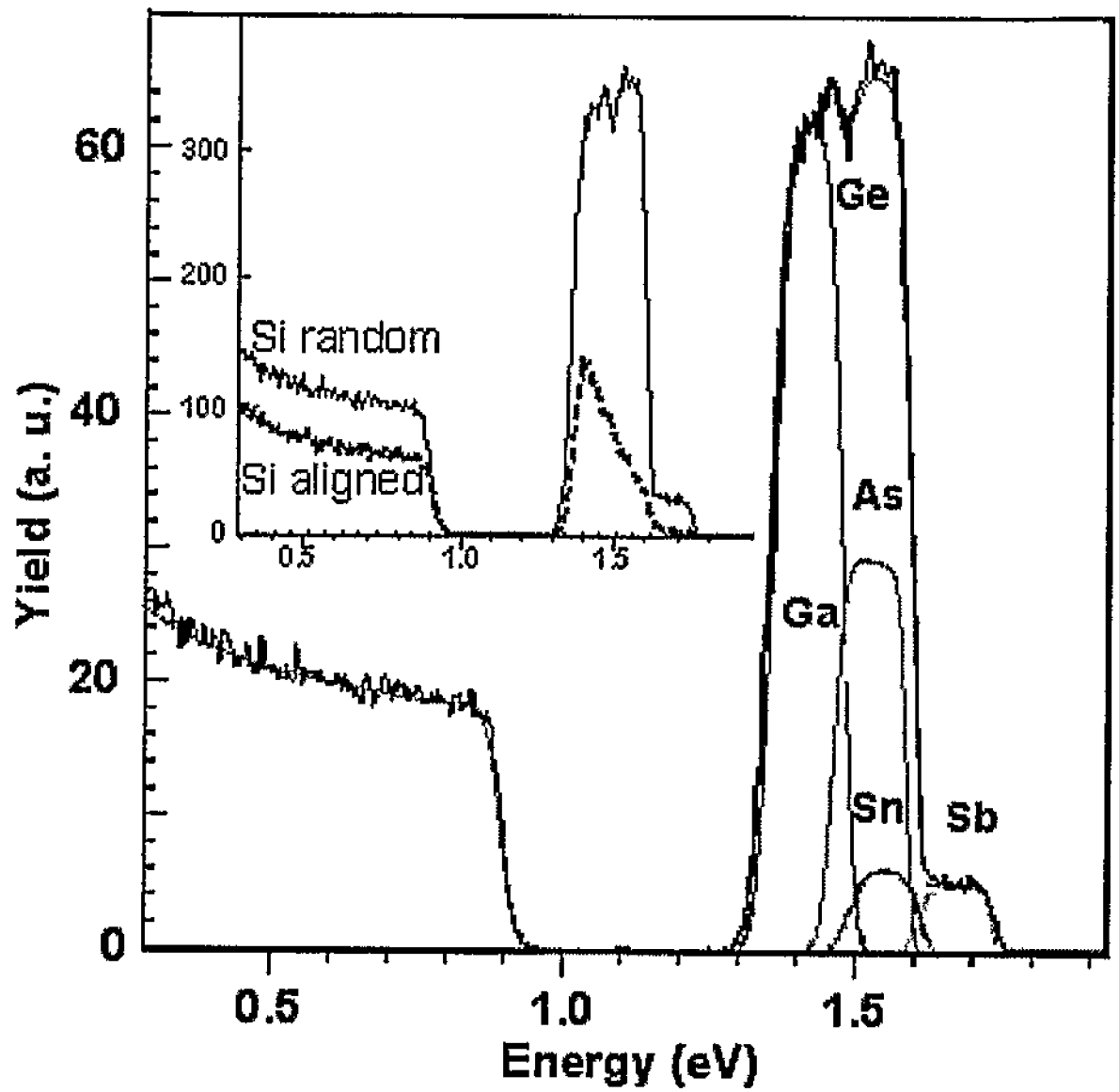
FIG. 15. RBS spectrum of a $GaAs_{0.92}Sb_{0.08}/Ge_{0.97}Sn_{0.03}$/Si(100) film showing the deconvoluted peaks of the constituent elements. Inset shows the RBS random (upper trace and aligned (lower trace) spectra of the sample FIG. 16. (224) XRD reciprocal space map for $GaAs_{0.85}Sb_{0.15}$ and $Ge_{0.93}Sn_{0.07}$ relative to the Si peak showing that the corresponding lattice parameters are identical. Note that the $Ge_{0.93}Sn_{0.07}$ and $GaAs_{0.85}Sb_{0.15}$ (224) peaks fall directly on the line connecting the Si peak to the origin consistent with a relaxed film.

Results:

Initially we concentrated on growth of lattice-matched $GaAs_{1-x}Sb_x$ films with strain free microstructures using $Ge_{1-x}Sn_x$ buffer layers with monotonically increasing Sn content from x=0.01 to x=0.07. These compositions display lattice parameters between 5.66 Å and 5.73 Å, respectively, and lattice match $GaAs_{1-x}Sb_x$ alloys with corresponding concentrations x=0.02-0.18. In addition, $GaAs_{1-x}Sb_x$ alloys with concentration up to x=0.40 (approaching the desired telecommunication range) were grown on $Ge_{0.93}Sn_{0.07}$ as mismatched heteroepitaxial layers with strained structures A typical RBS spectrum of a lattice matched $GaAs_{1-x}Sb_x/Ge_{1-x}Sn_x$ is shown in the FIG. 15. The random spectrum is deconvoluted to show separate elemental profiles for the Ge, Ga, As, Sn and In constituent elements. Simulations of composition and thickness revealed a 180 nm thick $GaAs_{0.92}Sb_{0.08}$ epilayer grown on a 200 nm thick $Ge_{0.97}Sn_{0.03}$ buffer. The inset in the figure is an aligned spectrum of the same sample showing uniform He ion channeling throughout the entire epilayer, indicating perfect epitaxial alignment and monocrystalline microstructure and low threading defect concentrations. The spectrum also shows that the elements in the film display the same degree of channeling which points to a fully substitutional monocrystalline $GaAs_{0.92}Sb_{0.08}$ epilayer and $Ge_{0.97}Sn_{0.03}$ buffer. High resolution XRD reciprocal space maps of the (224) Bragg reflections were recorded to determine the precise lattice dimensions and to investigate the strain state of the structures.

Figure 16:
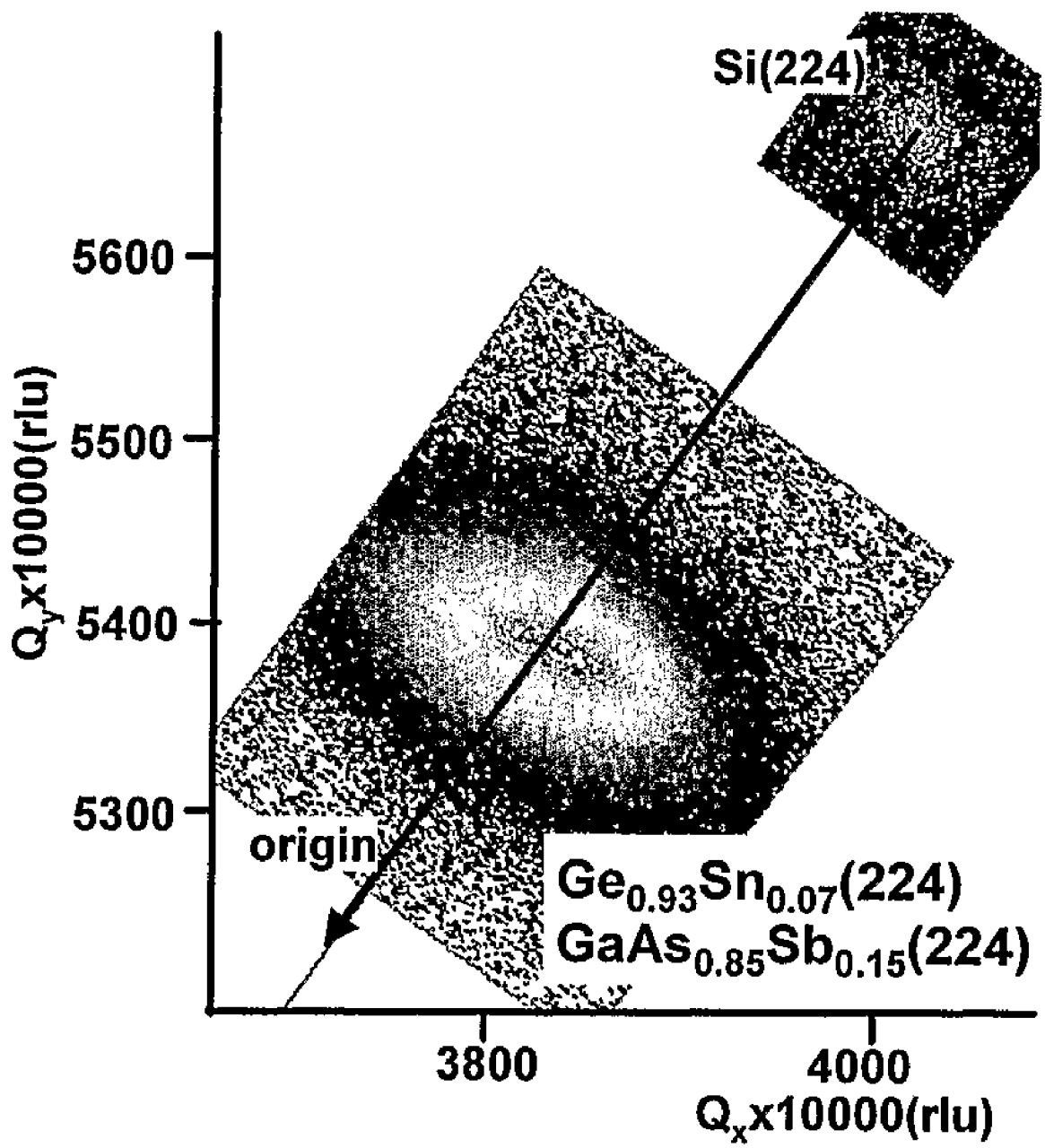
Figure 17:
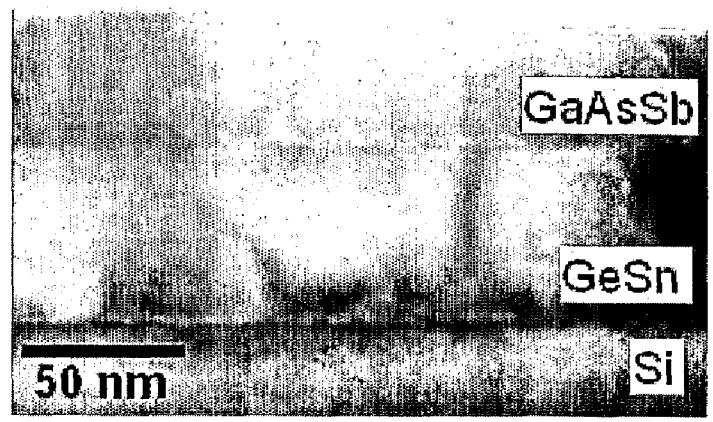
FIG. 17. Bright field XTEM micrograph of $GaAs_{0.85}Sb_{0.15}$ on $Ge_{0.93}Sn_{0.07}$.

The (224) peaks for GaAs$_{0.92}$Sb$_{0.08}$ and Ge$_{0.97}$Sn$_{0.03}$ layers overlap completely and have a common maximum indicating that both have identical lattice in-plane and vertical lattice parameters a$_{GeSn=aGaAsSb}$=5.687 Å and c$_{GeSn}$=c$_{GeSn}$=5.687 Å. The layers are strain free and lattice matched. The line connecting the Si(224) reflection with the origin of the XRD maps crosses the GaAs$_{0.92}$Sb$_{0.08}$/Ge$_{0.97}$Sn$_{0.03}$ peak through its maximum point confirming complete strain relaxation with respect to the Si substrate. Similar studies of a wide range of samples showed that we can obtain fully relaxed and lattice matched films on our Ge$_{(0.99-0.93)}$Sn$_{(0.01-0.07)}$ buffer layers. FIG. 16 shows a high-resolution (224) XRD spectrum of a fully relaxed 50 nm thick GaAs$_{0.85}$Sb$_{0.15}$ film, which is lattice matched to a 70 nm thick Ge$_{0.93}$Sn$_{0.07}$ buffer layer. A single (224) peak corresponding to the entire heterostructure is observed, as expected. The XRD lattice parameters of the buffer layer and the overlayer are identical: a$_{GeSn}$=a$_{GaAsSb}$=5.705 Å and c$_{GeSn}$=c$_{GaAsSb}$=5.712 Å. XTEM bright field images of this sample (FIG. 17) show abrupt and smooth interfaces between the layers. The lattice matching of the epilayer and the buffer promotes growth of perfect epitaxy and leads to very few threading defects propagating from the interface to the film surface. We note that the GeSn buffer layer with 7% Sn content remains perfectly crystalline and does not show any signs of structural or compositional degradation during the III-V deposition in this integration process.

Figure 18:
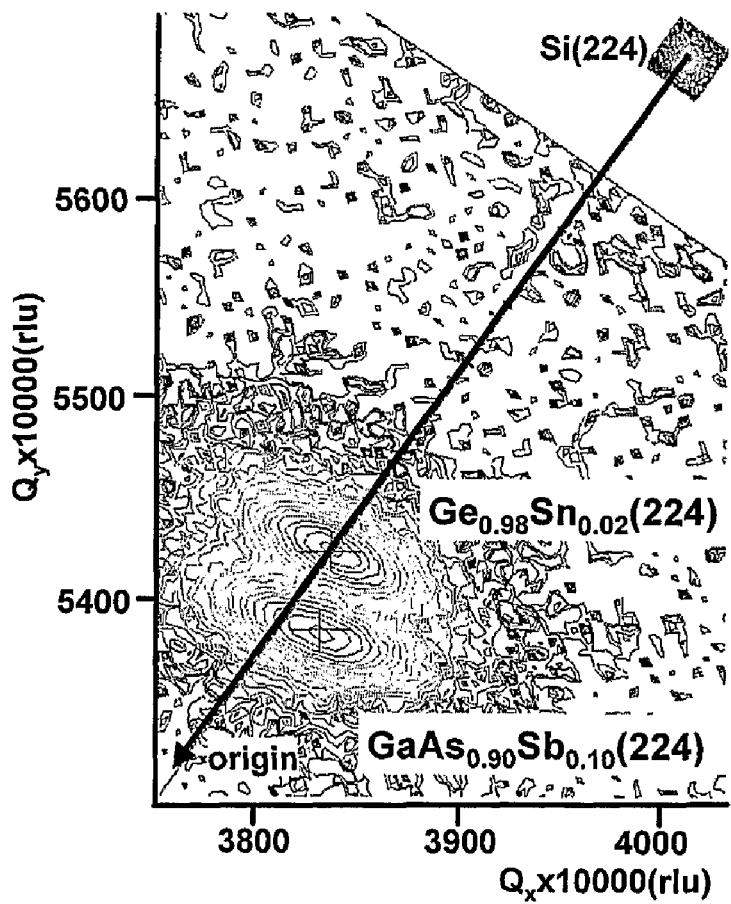
FIG. 18. (224) XRD reciprocal space maps of compressively strained $GaAs_{0.90}Sb_{0.10}$ grown on fully relaxed $Ge_{0.98}Sn_{0.02}$ buffer. Note that the corresponding in plane parameters (a) are identical.
Figure 19:
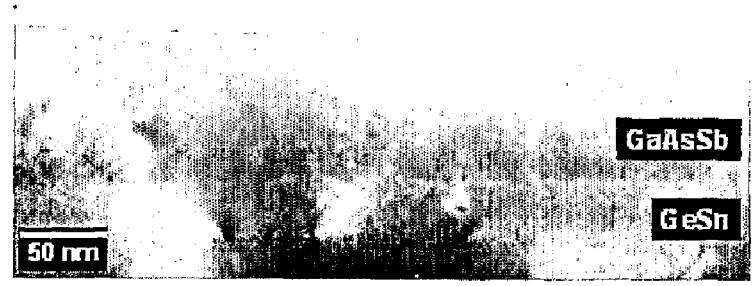
FIG. 19 Bright field XTEM micrograph of $GaAs_{0.90}Sb_{0.10}$ on $Ge_{0.98}Sn_{0.02}$.

In addition to the synthesized lattice matched samples we were also able to grow fully strained GaAs$_{1-x}$Sb$_x$ films on mismatched buffer layers. FIG. 18 shows the high-resolution XRD data of a virtually coherent and compressively strained GaAs$_{0.90}$Sb$_{0.10}$ (150 nm) layer grown on fully relaxed Ge$_{0.98}$Sn$_{0.02}$ (200 nm) buffer layer. The corresponding lattice parameter are a$_{GeSn}$=5.677 Å, c$_{GeSn}$=5.679 Å, a$_{GaAsSb}$=5.682 Å and c$_{GaAsSb}$=5.722 Å, respectively. Bright field XTEM micrographs (see FIG. 19) show no threading defects within the field of view indicating good crystallinity. The high-resolution images revealed defect-free and heteroepitaxial interfaces as is expected for such highly coherent growth.

Figure 20:
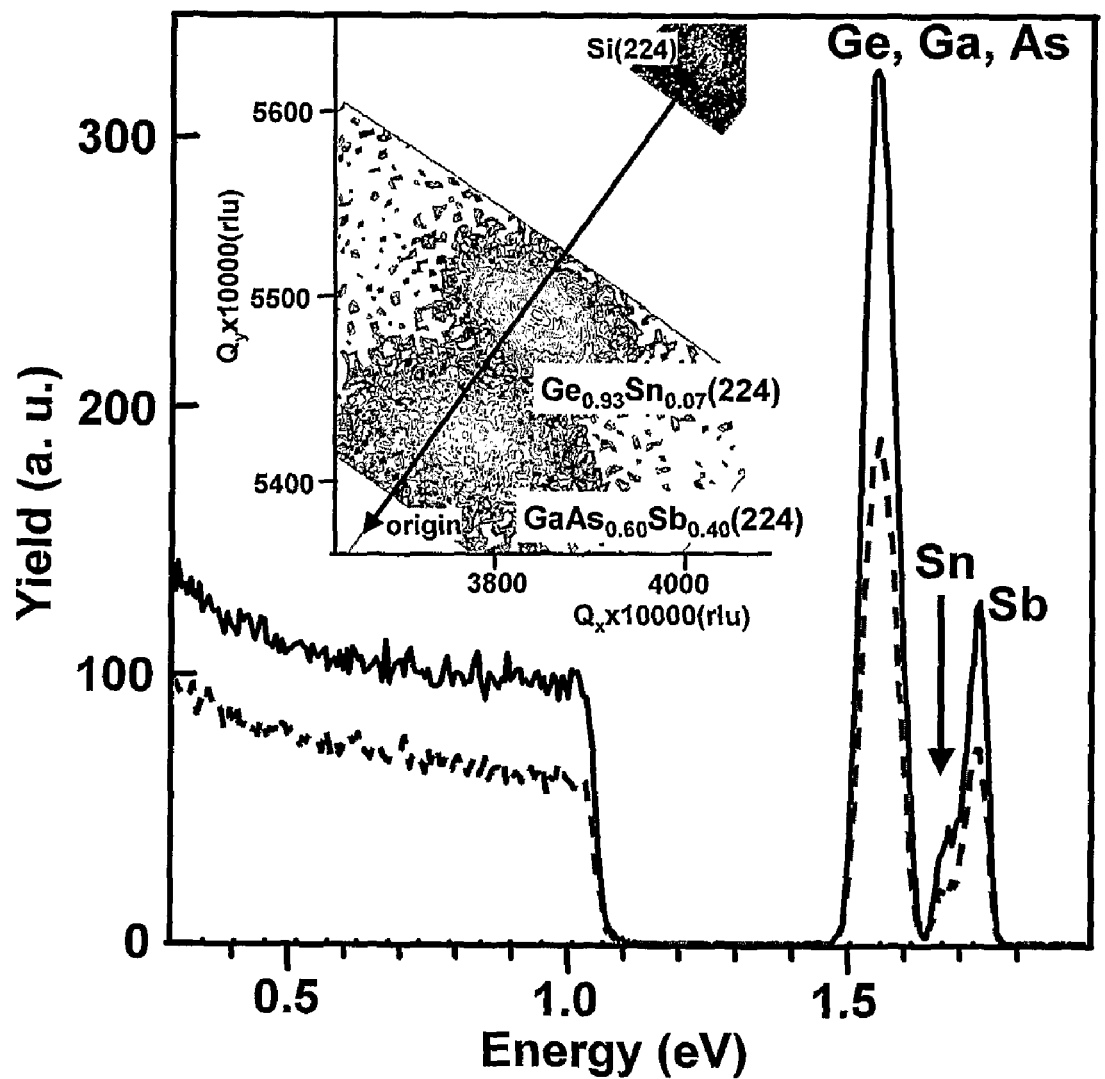
FIG. 20. Random (solid line) and aligned (dashed line) RBS spectrum of a $GaAs_{0.60}Sb_{0.40}$ film grown on $Ge_{0.93}Sn_{0.07}$ buffer layer. Inset: Corresponding XRD reciprocal space map of the (224) reflections showing a nearly relaxed $GaAs_{0.60}Sb_{0.40}$ layer.

GaAs$_{1-x}$Sb$_x$ ternary alloys with bandgaps in the telecommunication range and corresponding compositions greater than x=0.35 typically require buffer layers with Sn contents of 10-15 at. %. Although we have not yet used these to grow lattice matched GaAs$_{1-x}$Sb$_x$, we have been able to grow mismatched films with composition GaAs$_{0.60}$Sb$_{0.40}$ (a~5.83 Å), on 7% Sn buffer layers (a=5.73 Å). The lattice mismatch in this case seems to be accommodated largely by formation of edge dislocations at the interface. Threading defects are also occasionally observed in the bright field images of the films. FIG. 20 shows an RBS spectrum of a 50 nm thick GaAs$_{0.60}$Sb$_{0.40}$ on a 75 nm Ge$_{0.93}$Sn$_{0.07}$ buffer. Signals from all constituent elements in the structure channel uniformly suggesting that both layers are homogeneous and crystalline. The high resolution XRD data based on (224) and (004) measurements gave lattice parameters a$_{GaAsSb}$=5.845 Å and c$_{GaAsSb}$=5.802 Å indicating a partially strained material.

We claim:

1. A semiconductor structure comprising:
   (a) a Si substrate;
   (b) a Ge$_{1-x}$Sn$_x$ buffer layer formed over the substrate; and
   (c) an active layer formed over the buffer layer, wherein the active layer is selected from the group consisting of
      (i) a Group III-V layer; and
      (ii) a Group II-VI layer,
   wherein the buffer layer and the active layer are thermally matched and lattice matched.

2. A semiconductor structure comprising:
   (a) an Si substrate;
   (b) a GeSn buffer layer formed over the substrate;
   (c) an Ge$_{1-x-y}$Si$_x$Sn$_y$ template layer formed over the buffer layer; and
   (d) an active layer formed over the buffer layer, wherein the active layer is selected from the group consisting of
      (i) a Group III-V layer;
      (ii) a Group II-VI layer;
      (iii) an SiGe layer; and
      (iv) a Ge layer,
   wherein the buffer layer and the active layer are thermally matched and lattice matched.

3. The semiconductor structure of claim 1 or claim 2, wherein the active layer is a Group III-V layer, and wherein the Group III-V layer comprises an alloy selected from the group consisting of InAs, GaAs, InGaAs, AlAs, InP, GaSb, InSb, GaAsSb, and AlGaAs.

4. The semiconductor structure of claim 1 or claim 2, wherein the active layer is a Group II-VI layer, and wherein the Group II-VI layer comprises an alloy selected from the group consisting of ZnSe, ZnS, ZnCdTe, CdS, ZnSeTe, ZnSTe, CdMnTe, CdTe, CdSe, and HgCdTe.

5. The semiconductor structure of claim 3, wherein the active layer comprises InAs.

6. The semiconductor structure of claim 3, wherein the active layer comprises GaAs.

7. The semiconductor structure of claim 3, wherein the active layer comprises AlGaAs.

8. The semiconductor structure of claim 3, wherein the active layer comprises GaAsSb.

9. The semiconductor structure of claim 3, wherein the active layer comprises InGaAs.

10. The semiconductor structure of claim 2, wherein the active layer is an SiGe layer.

11. The semiconductor structure of claim 2, wherein the active layer is a Ge layer.

12. The semiconductor structure of claim 1 or claim 2, wherein the GeSn layer is of the formula Ge$_{1-x}$Sn$_x$, wherein x is between 0.02 and 0.20.

13. The semiconductor structure of claim 1 or claim 2, wherein the silicon substrate comprises Si(100).

14. The semiconductor structure of claim 1 or claim 2, wherein the active layer further comprises a dopant.

15. The semiconductor structure of claim 1 or 2, wherein the active layer has a density of threading defects of $10^5/cm^2$ or less.

16. The semiconductor structure of claim 2, having Ge$_{1-x-y}$Si$_x$Sn$_y$ wherein $0.01 < y \leq 0.11$, and $0.26 \leq x \leq 0.35$.

17. The semiconductor structure of claim 16, wherein $x \geq 0.28$.

18. The semiconductor structure of claim 16, wherein $x \geq 0.30$.

19. The semiconductor structure of claim 16, wherein $x \geq 0.32$.

* * * * *